(12) United States Patent
Koshimizu et al.

(10) Patent No.: US 11,574,798 B2
(45) Date of Patent: Feb. 7, 2023

(54) PLASMA PROCESSING APPARATUS AND CONTROL METHOD

(71) Applicant: TOKYO ELECTRON LIMITED, Tokyo (JP)

(72) Inventors: Chishio Koshimizu, Miyagi (JP); Shin Hirotsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/872,432

(22) Filed: May 12, 2020

(65) Prior Publication Data

US 2020/0273670 A1 Aug. 27, 2020

Related U.S. Application Data

(63) Continuation of application No. 16/597,193, filed on Oct. 9, 2019, now Pat. No. 10,672,589.

(30) Foreign Application Priority Data

Oct. 10, 2018 (JP) .............................. JP2018-191735
Aug. 28, 2019 (JP) .............................. JP2019-156107

(51) Int. Cl.
*H01J 37/16* (2006.01)
*H01J 37/32* (2006.01)
(Continued)

(52) U.S. Cl.
CPC ........ *H01J 37/32027* (2013.01); *H01J 37/04* (2013.01); *H01J 37/16* (2013.01);
(Continued)

(58) Field of Classification Search
CPC ................. H01J 37/32027; H01J 37/16; H01J 37/32642; H01J 37/04; H01J 37/32082;
(Continued)

(56) References Cited

U.S. PATENT DOCUMENTS

2006/0066247 A1* 3/2006 Koshiishi .......... H01J 37/32422
315/111.21
2009/0026170 A1* 1/2009 Tanaka .............. H01J 37/32091
216/60
(Continued)

FOREIGN PATENT DOCUMENTS

JP  2005-277369 A  10/2005
JP  2010-021404 A  1/2010
(Continued)

*Primary Examiner* — Minh D A
(74) *Attorney, Agent, or Firm* — Weihrouch IP

(57) ABSTRACT

A plasma processing apparatus includes a container; a stage disposed in the container and including an electrode; a plasma source that generates plasma in the container; a bias power supply that periodically supplies a pulsed negative DC voltage to the electrode; an edge ring disposed to surround a substrate placed on the stage; and a DC power supply that supplies a DC voltage to the edge ring. The DC power supply supplies a first DC voltage in a first time period when the pulsed negative DC voltage is not supplied to the electrode, and supplies a second DC voltage in a second time period when the pulsed negative DC voltage is supplied to the electrode.

24 Claims, 21 Drawing Sheets

(51) Int. Cl.
*H01J 37/04* (2006.01)
*H01J 37/24* (2006.01)

(52) U.S. Cl.
CPC ....... *H01J 37/32642* (2013.01); *H01J 37/241* (2013.01); *H01J 37/32082* (2013.01)

(58) Field of Classification Search
CPC ............... H01J 37/241; H01J 37/32201; H01J 37/32293; H01J 37/32128; H01L 21/67253
See application file for complete search history.

(56) References Cited

U.S. PATENT DOCUMENTS

| | | | |
|---|---|---|---|
| 2014/0144876 A1 | 5/2014 | Nakagawa et al. | |
| 2014/0149221 A1 | 5/2014 | Rycyna, III | |
| 2015/0000842 A1* | 1/2015 | Hirano | H01J 37/32045 156/345.28 |
| 2015/0325413 A1* | 11/2015 | Kim | H01J 37/32449 315/111.21 |
| 2016/0056017 A1* | 2/2016 | Kim | H01J 37/32706 156/345.28 |
| 2016/0189994 A1* | 6/2016 | Sasaki | H01L 21/6833 361/234 |
| 2017/0066103 A1* | 3/2017 | Tomioka | B24B 37/20 |

FOREIGN PATENT DOCUMENTS

| | | |
|---|---|---|
| JP | 2015-012249 A | 1/2015 |
| JP | 2018-117024 A | 7/2018 |
| KR | 10-1043318 B1 | 6/2011 |

\* cited by examiner ical field

The present disclosure relates to a plasma processing apparatus and a control method.

BACKGROUND

There is known a plasma processing apparatus capable of improving the in-plane uniformity of processing by an edge ring provided at the periphery of a wafer placed on a stage (see, e.g., Japanese Patent Laid-Open Publication No. 2005-277369). In a plasma processing apparatus, an etching process is performed with plasma generated from a gas by a radio-frequency power, so as to form fine holes or the like in the wafer.

SUMMARY

An aspect of the present disclosure provides a plasma processing apparatus including: a processing container; an electrode configured to place a workpiece thereon in the processing container; a plasma generation source configured to supply plasma into the processing container; a bias power supply configured to supply a bias power to the electrode; an edge ring disposed at a periphery of the workpiece; a DC power supply configured to supply a DC voltage to the edge ring; and a controller configured to execute a first control procedure in which the DC voltage periodically repeats a first state having a first voltage value and a second state having a second voltage value higher than the first voltage value, the first voltage value is supplied in a partial time period within each period of a potential of the electrode, and the second voltage value is supplied such that the first state and the second state are continuous.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, a frequency of a source power (radio-frequency) will also be referred to as HF (high frequency), and the source power will also be referred to as an HF power. Further, a frequency of a bias power (radio-frequency) having a frequency lower than the frequency of the source power will also be referred to as LF (low frequency), and the bias power will also be referred to as an LF power.

INTRODUCTION

Recently, the frequency of LF that is applied to the stage of the plasma processing apparatus has been lowered from about 3.2 MHz to about 400 kHz. Under this process condition, a problem occurs in that the roundness of the etching shape of a hole formed near the edge of a semiconductor wafer (hereinafter, also referred to as a wafer) collapses in the radial direction, and thus, an elliptical hole with a radially long side is formed. Further, there is a problem in that the consumption of the edge ring (also called a focus ring) disposed at the periphery of the wafer causes a tilting in which the etching shape at the edge of the wafer is formed obliquely inward.

Thus, in the plasma processing apparatus according to the present embodiment, the problems described above are solved by making the shape of a hole at the edge of a wafer W into a complete circle and preventing the tilting. Hereinafter, descriptions will be made on an example of a plasma processing apparatus 1 according to the present embodiment, and a control of a direct current voltage (hereinafter, also referred to as a "DC voltage") using the plasma processing apparatus 1.

[Entire Configuration of Plasma Processing Apparatus]

Figure 1:
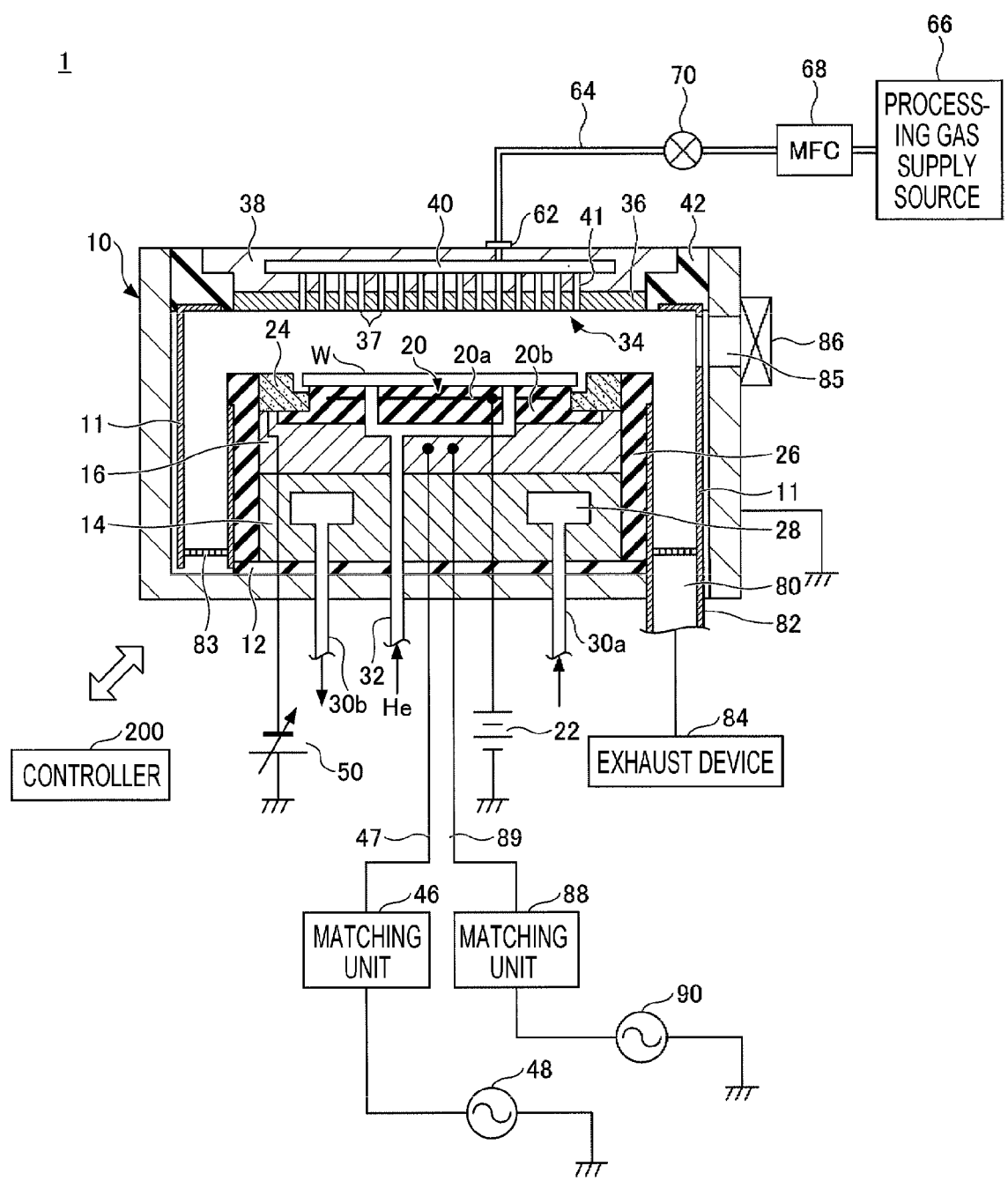
FIG. 1 is a view illustrating an example of a plasma processing apparatus according to an embodiment.

FIG. 1 is a view illustrating an example of the plasma processing apparatus 1 according to an embodiment. The plasma processing apparatus 1 according to the present embodiment is a capacitively coupled parallel flat plate plasma processing apparatus, and includes a cylindrical processing container 10 made of, for example, aluminum with an anodized surface. The processing container 10 is grounded.

A columnar support 14 is disposed on the bottom of the processing container 10 via an insulating plate 12 made of, for example, ceramics, and a stage 16 made of, for example, aluminum is provided on the support 14. The stage 16 constitutes a lower electrode, and the wafer W which is an example of a target object to be processed is placed on the stage 16 via an electrostatic chuck 20.

The electrostatic chuck 20 is provided on the upper surface of the stage 16 to adsorb and hold the wafer W thereon by an electrostatic force. The electrostatic chuck 20 has a structure in which an electrode 20a made of a conductive film is sandwiched between insulating layers 20b, and a DC power supply 22 is connected to the electrode 20a. Then, the wafer W is adsorbed and held on the electrostatic chuck 20 by an electrostatic force such as the Coulomb force generated by a DC voltage from the DC voltage supply 22.

A conductive edge ring 24 made of, for example, silicon is disposed at the periphery of the wafer W on the stage 16. The edge ring 24 is also called a focus ring. A cylindrical inner wall member 26 made of, for example, quartz is provided on the lateral surfaces of the stage 16 and the support 14.

A coolant chamber 28 is provided inside the support 14, for example, on the circumference of the support 14. A coolant, for example, cooling water having a predetermined temperature is supplied in a circulative manner from a chiller unit provided outside the coolant chamber 28 through pipes 30a and 30b, and the processing temperature of the wafer W on the stage 16 is controlled by the temperature of the coolant. In addition, the coolant is an example of a temperature adjustment medium that is supplied to the pipes 30a and 30b in a circulative manner, and the temperature adjustment medium may cool or heat the stage 16 and the wafer W. Further, a heat transfer gas, for example, He gas is supplied between the upper surface of the electrostatic chuck 20 and the back surface of the wafer W from a heat transfer gas supply mechanism through a gas supply line 32.

An upper electrode 34 is provided above the stage 16 to face and be parallel with the stage 16. The space between the upper electrode 34 and the lower electrode is a plasma processing space. The upper electrode 34 forms a surface that faces the wafer W on the stage 16 and is in contact with the plasma processing space, that is, a facing surface.

The upper electrode 34 is supported on the upper portion of the processing container 10 via an insulating shielding member 42. The upper electrode 34 includes an electrode plate 36 that constitutes the surface facing the stage 16 and is provided with a large number of gas ejection holes 37, and an electrode support 38 that detachably supports the electrode plate 36 and is made of a conductive material, for example, aluminum with an anodized surface. The electrode plate 36 may be made of silicon or SiC. A gas diffusion chamber 40 is provided inside the electrode support 38, and a large number of gas flow holes 41 extend downward from the gas diffusion chamber 40 to communicate with the gas ejection holes 37.

In the electrode support 38, a gas inlet 62 is formed to introduce a processing gas into the gas diffusion chamber 40, a gas supply pipe 64 is connected to the gas inlet 62, and a processing gas supply source 66 is connected to the gas supply pipe 64. In the gas supply pipe 64, a mass flow controller (MFC) 68 and an opening/closing valve 70 are provided in this order from the upstream side. Then, a processing gas for etching reaches the gas diffusion chamber 40 from the processing gas supply source 66 through the gas supply pipe 64, and is ejected into the plasma processing space from the gas ejection holes 37 in a shower form through the gas flow holes 41. In this manner, the upper electrode 34 functions as a shower head for supplying a processing gas.

A variable DC power supply 50 is electrically connected to the edge ring 24, and a DC voltage is applied from the variable DC power supply 50. A controller 200 controls the polarity and current/voltage of a DC voltage and a DC current supplied from the variable DC power supply 50, and an electronic switch that turns On/Off the DC voltage and the DC current.

A first radio-frequency power supply 48 is electrically connected to the stage 16 via a power feeding rod 47 and a matching unit 46. The first radio-frequency power supply 48 applies an LF power to the stage 16. As a result, ions are drawn into the wafer W on the stage 16. The first radio-frequency power supply 48 outputs a radio-frequency power having a frequency within a range of 200 kHz to 13.56 MHz. The matching unit 46 matches the internal impedance of the first radio-frequency power supply 48 and a load impedance with each other.

A second radio-frequency power supply 90 is connected to the stage 16 via a power feeding rod 89 and a matching unit 88. The second radio-frequency power supply 90 applies an HF power to the stage 16. The frequency of HF may be 13.56 MHz or more, for example, 100 MHz. The frequency of LF is lower than the frequency of HF and may be, for example, 400 kHz. The matching unit 88 matches the internal impedance of the second radio-frequency power supply 90 and a load impedance with each other. A filter 94 may be connected to the stage 16 to cause a predetermined radio-frequency to pass through the ground. In addition, the HF power supplied from the second radio-frequency power supply 90 may be applied to the upper electrode 34.

An exhaust port 80 is provided at the bottom of the processing container 10, and an exhaust device 84 is connected to the exhaust port 80 via an exhaust pipe 82. The exhaust device 84 includes a vacuum pump such as a turbo molecular pump, and is able to reduce the pressure inside the processing container 10 to a desired degree of vacuum. In addition, a carry-in/out port 85 is provided in the side wall of the processing container 10, and is openable/closable by a gate vale 86. In addition, a deposit shield 11 is detachably provided along the inner wall of the processing container 10 to prevent etching by-products (deposits) from adhering to the processing container 10. That is, the deposit shield 11 constitutes the processing container wall. Further, the deposit shield 11 is also provided on the outer periphery of the inner wall member 26. An exhaust plate 83 is provided between the deposit shield 11 of the processing container wall and the deposit shield 11 of the inner wall member 26, at the bottom of the processing container 10. For the deposit shield 11 and the exhaust plate 83, an aluminum material coated with ceramics such as $Y_2O_3$ may be used.

When an etching process is performed in the plasma processing apparatus having the configuration described above, first, the gate valve 86 is brought into an open state, and the wafer W to be etched is carried into the processing container 10 through the carry in/out port 85 and placed on the stage 16. Then, a processing gas for etching is supplied from the processing gas supply source 66 to the gas diffusion chamber 40 at a predetermined flow rate, and supplied into the processing container 10 through the gas flow holes 41 and the gas ejection holes 37. Further, the inside of the processing container 10 is exhausted by the exhaust device 84, such that the pressure inside the processing container 10 becomes a set value within a range of, for example, 0.1 Pa to 150 Pa. Here, various gases that are used in related arts may be employed as the processing gas, and for example, a gas containing a halogen element which is a fluorocarbon gas ($C_xF_y$) such as $C_4F_8$ gas as a representative example may be appropriately used. In addition, other gases such as Ar gas and $O_2$ gas may be contained.

As described above, in a state where the etching gas is introduced into the processing container 10, a HF power is applied to the stage 16 from the second radio-frequency power supply 90. Further, a LF power is applied to the stage 16 from the first radio-frequency power supply 48. Further, a DC voltage is applied to the electrode 20a from the DC power supply 22, and the wafer W is held on the stage 16. Further, a negative DC voltage is applied to the edge ring 24 from the variable DC power supply 50.

The processing gas ejected from the gas ejection holes 37 of the upper electrode 34 is dissociated and ionized mainly by the HF power, so that plasma is generated. The processing target surface of the wafer W is etched by radicals or ions in the plasma. In addition, by applying the LF power to the stage 16, it is possible to broaden a plasma control margin such as controlling ions in plasma and enabling etching of holes with a high aspect ratio.

The plasma processing apparatus 1 is provided with the controller 200 that controls the operation of the entire apparatus. The controller 200 executes desired plasma processing such as etching, according to a recipe stored in a memory such as a read only memory (ROM) or a random access memory (RAM). In the recipe, for example, process time, a pressure (exhaust of gas), a radio-frequency power or voltage, flow rates of various gases, the temperature inside the processing container (e.g., the temperature of the upper electrode, the temperature of the side wall of the processing container, the temperature of the wafer W or the temperature of the electrostatic chuck), and the temperature of the coolant output from the chiller unit are set as control information of the apparatus for process conditions. In addition, the recipe that represents the programs or process conditions may be stored in a hard disk or a semiconductor memory. In addition, the recipe may be set at a predetermined position in a state of being stored in a portable computer-readable storage medium such as a CD-ROM or a DVD, and may be read out.

For example, the controller 200 may perform a control to apply the negative DC voltage output from the variable DC power supply 50 in a partial time period within each period of a voltage, current or electromagnetic field measured in a transmission path of the bias power, a variance of light emission of generated plasma, or a variance of sheath thickness of plasma above the wafer W (the lower electrode) (hereinafter, also referred to as a "periodically varying parameter"), and to alternately repeat the On/Off of the negative DC voltage. The controller 200 may perform a control to apply the voltage of HF output from the second radio-frequency power supply 90 in a partial time period within each period of the periodically varying parameter, and to alternately repeat the On/Off of the voltage of HF. As a result, the shape of a hole at the edge of the wafer W may be made in a complete circle, and the tilting may be prevented.

The transmission path of the bias power refers to the first radio-frequency power supply 48→the matching unit 46→the power feeding rod 47→the stage 16→plasma→the upper electrode 34→(ground). The voltage, current or electromagnetic field measured in the transmission path of the bias power refers to a voltage, current or electromagnetic field measured in the portion from the first radio-frequency power supply 48 to the stage 16 via the inside of the matching unit 46 and the power feeding rod 47, and in the upper electrode 34, or an electromagnetic field measured with plasma.

The negative DC voltage is controlled such that a first state and a second state to be described later are periodically repeated, the first state is applied in a partial time period within each period of the periodically varying parameter, and the second state is applied continuously with the first state.

The periodically varying parameter may be any one of a voltage, current, and electromagnetic field measured in any one of the members from the stage 16 to the inside of the matching unit connected via the power feeding rod 47.

The On/Off of the DC voltage or High/Low of an absolute value of the DC voltage may be controlled to be synchronized with a signal synchronized with the period of the radio-frequency or pulse wave of the bias power, or a phase within one period of any one of a voltage, current, and an electromagnetic field measured in the transmission path of the bias power (power feeding system). For example, the controller 200 may control the On/Off or High/Low of the DC voltage to be synchronized with the phase within one period of a voltage or current of LF.

In addition, the state of the signal synchronized with the period of the radio-frequency or pulse wave of the bias power, or any one of the voltage, current, and electromagnetic field measured in the power feeding system of the bias power will also be referred to as a "reference electrical state." The DC voltage may be controlled such that the first state and the second state to be described later are alternately applied in synchronization with the phase within one period of the reference electrical state.

Figure 2:
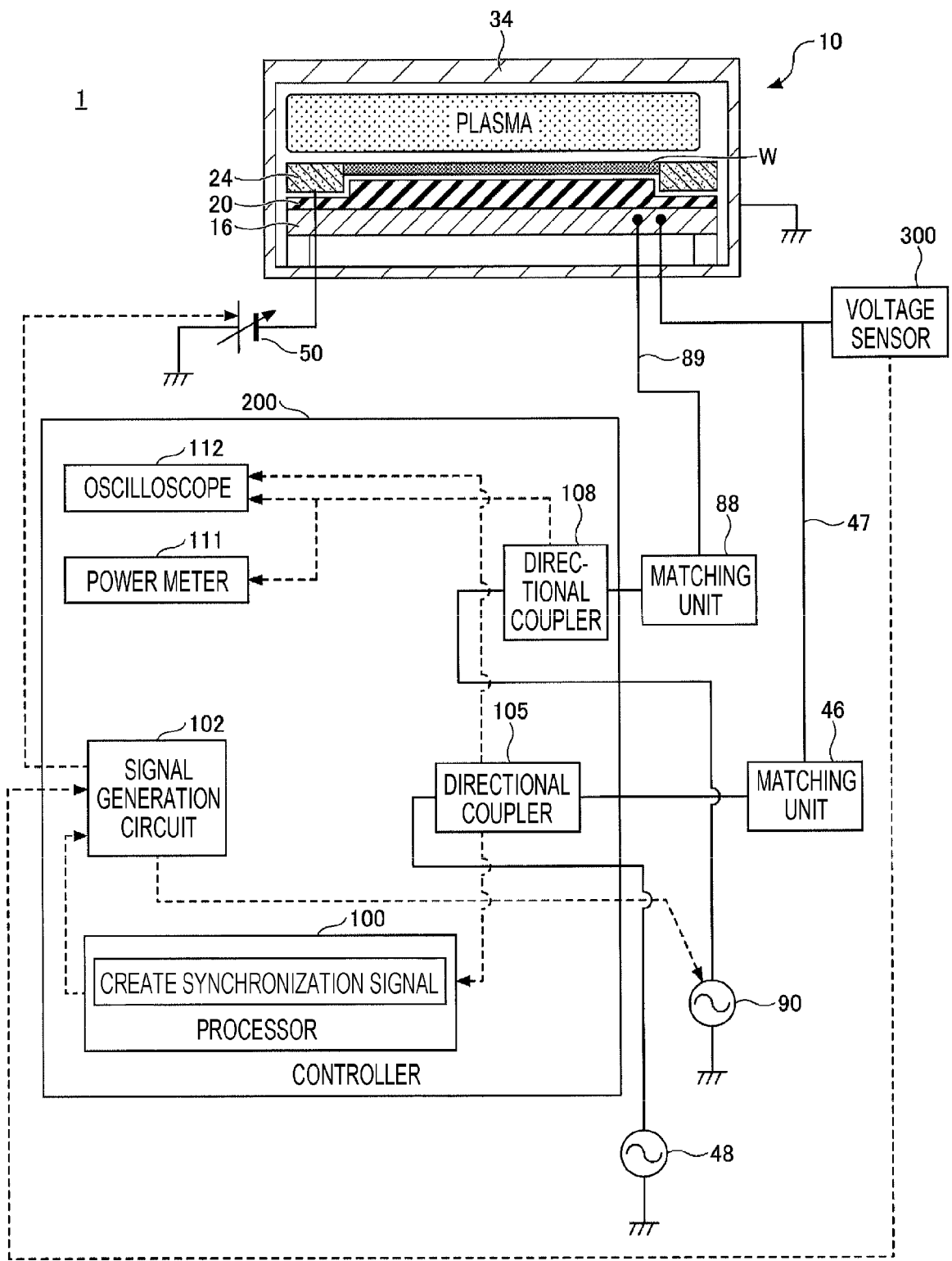
FIG. 2 is a view illustrating an example of a configuration of a controller according to the embodiment.

As the method of measuring the periodically varying parameter in the transmission path of the bias power, there is, for example, a method of installing a voltage sensor, a current sensor or a BZ sensor (a sensor for measuring an induced magnetic field) near any one portion of the transmission path of the bias power, and measuring a voltage, current or induced magnetic field of each portion. In addition, while FIG. 2 illustrates a voltage sensor 300, the sensor is not limited thereto and may be a current sensor or a BZ sensor. In addition, each sensor described above may be connected to the power feeding rod 47, but the arrangement of each sensor is not limited thereto. A signal from the sensor such as the voltage sensor 300 is input to, for example, a signal generation circuit 102 of the controller 200.

In addition, the period of light emission of plasma and the period of the variance of sheath thickness of plasma above the wafer W may be used as indexes. The period of light emission of plasma may be detected by, for example, a photodiode- or photomicro-sensor. As for the sheath thickness, the variance of sheath thickness may be measured by using, for example, an ICCD camera and clicking the shutter of the camera at an interval of nanoseconds (e.g., 10 nsec to 250 nsec).

In addition, the stage 16 is an example of an electrode for placing the wafer W thereon (the lower electrode). The upper electrode is an example of an electrode that faces the lower electrode. The first radio-frequency power supply 48 is an example of a bias power supply that supplies a bias power to the lower electrode. The second radio-frequency power supply 90 is an example of a source power supply that supplies a source power having a frequency higher than the bias power, to the lower electrode or the upper electrode. The variable DC power supply 50 is an example of a DC power supply that supplies a DC voltage to the edge ring 24. The source power supply corresponds to a plasma generation source that supplies plasma into the processing container 10.

The controller 200 is an example of a controller that controls the bias power supply, the source power supply, and the DC power supply. The potential of the lower electrode (the stage 16) to which the bias power is applied will also be referred to as an electrode potential.

[Configuration of Controller]

The specific configuration of the controller 200 will be described with reference to FIG. 2. The controller 200 includes a processor 100, the signal generation circuit 102, directional couplers 105 and 108, a power meter 111, and an oscilloscope 112. However, the power meter 111, the oscilloscope 112, and the directional coupler 108 may not be provided.

In the power feeding line of the first radio-frequency power supply 48, the directional coupler 105 is connected between the first radio-frequency power supply 48 and the matching unit 46. In the power feeding line of the second radio-frequency power supply 90, the directional coupler 108 is connected between the second radio-frequency power supply 90 and the matching unit 88.

The directional coupler 105 gives a portion of a traveling wave power of LF to the oscilloscope 112. The directional coupler 108 gives a portion of a traveling wave power of HF to the oscilloscope 112. In an embodiment, the frequency of LF displayed on the oscilloscope 112 is, for example, 400 kHz, and the frequency of HF displayed on the oscilloscope 112 is, for example, 100 MHz. Accordingly, in the oscilloscope 112, the waveform of the traveling wave of LF and the waveform of the traveling wave of HF may be observed.

The directional coupler 108 gives a portion of the traveling wave of HF to the power meter 111. The power meter 111 measures the electric energy of the traveling wave of HF.

The directional coupler 105 gives a portion of the traveling wave of LF to the processor 100. The processor 100 creates a DC synchronization signal to be synchronized with the traveling wave of LF. For example, the processor 100 may create the DC synchronization signal in synchronization with a positive timing of the traveling wave of LF. In addition, instead of the directional coupler 105, the waveform of LF detected by the sensor described above may be given to the processor 100.

The processor 100 gives the created synchronization signal to the signal generation circuit 102. The signal generation circuit 102 generates a control signal that is synchronized with the traveling wave of LF from the given synchronization signal, and gives the generated control signal to the variable DC power supply 50 and the first radio-frequency power supply 48.

There are two methods for generating the control signal as follows. In a case where the first radio-frequency power supply 48 is a general power supply, the directional coupler 105 takes out a portion of the LF power output from the first radio-frequency power supply 48 as a waveform, and inputs the waveform to the processor 100. However, the present disclosure is not limited thereto, and the processor 100 may directly input a portion of the LF power from the first radio-frequency power supply 48. The processor 100 creates an ON signal in synchronization with the signal of the input waveform or having an arbitrary delay and an arbitrary width from the signal of the input waveform, and transmits the ON signal to the signal generation circuit 102. The processor 100 may directly generate a signal of LF for controlling the first radio-frequency power supply 48 and create an ON signal in synchronization with the signal of LF or having an arbitrary delay and an arbitrary width from the signal of LF, without inputting a portion of the LF power from the first radio-frequency power supply 48. The ON signal is an example of a synchronization signal.

The signal generation circuit 102 sends a command signal to the variable DC power supply 50 in order to generate the DC voltage during the ON signal. As the command signal, a control signal for generating the DC voltage during the ON signal or the ON signal itself is used according to the input form of the variable DC power supply 50. Similarly, the signal generation circuit 102 may send a command signal to the second radio-frequency power supply 90 in order to generate the HF power during the ON signal.

In a case where the first radio-frequency power supply 48 is an amplifier that amplifies the LF power, voltage or current, the signal generation circuit 102 may take out a portion of the LF output from the first radio-frequency power supply 48 as a waveform, and create an ON signal having an arbitrary delay and an arbitrary width from the signal of the waveform, rather than using the signal from the directional coupler 105. The signal generation circuit 102 transmits the signal of the waveform and the ON signal to the variable DC power supply 50.

For example, instead of the variable DC power supply 50, an AC power supply (not illustrated) may be provided and electrically connected to the edge ring 24, such that a radio-frequency voltage may be applied from the AC power supply to the edge ring 24 based on a control (ON) signal. The variable DC power supply 50 or the AC power supply is an example of a power supply that supplies at least one of a negative DC voltage and a radio-frequency voltage to the edge ring 24.

Figure 3A:
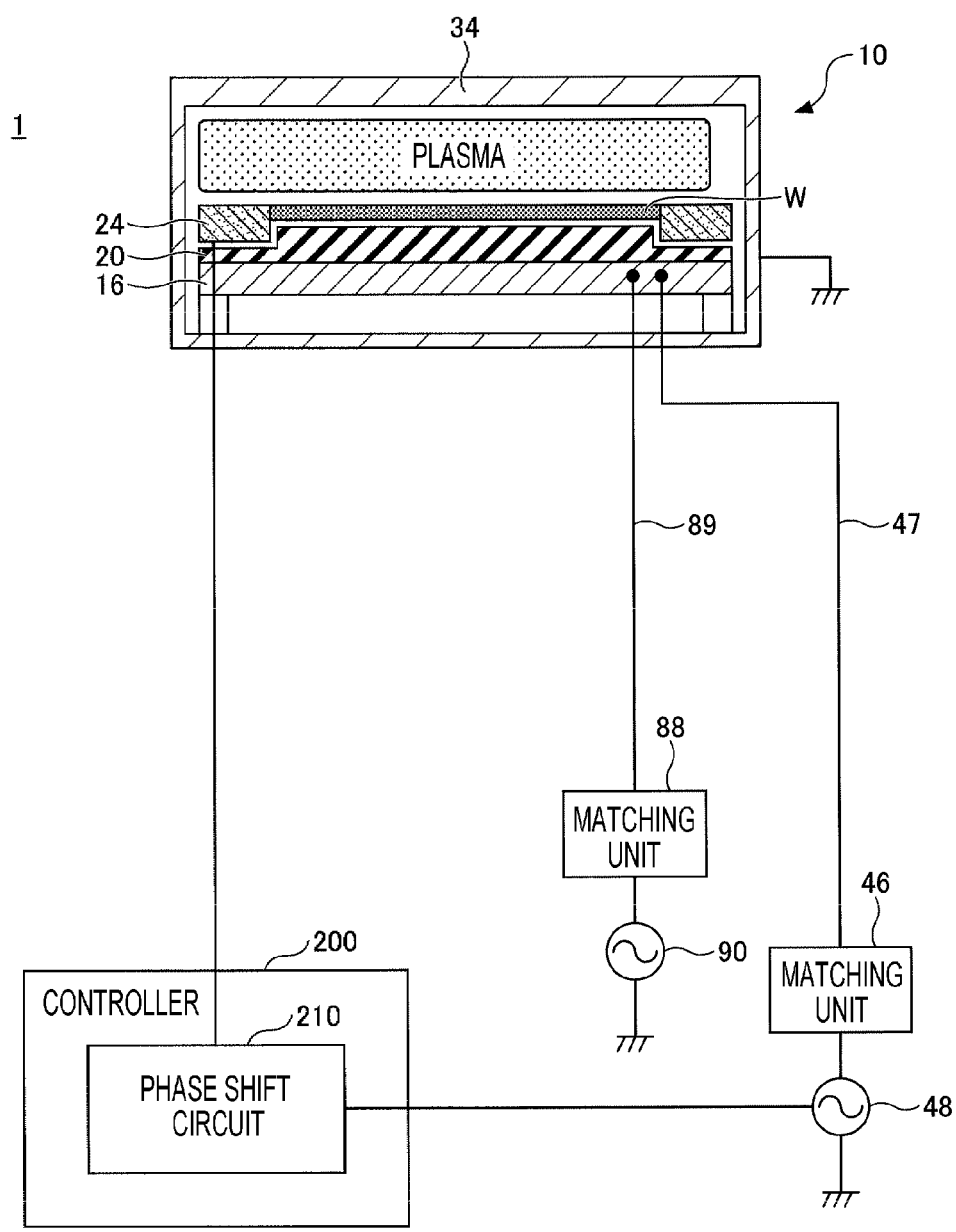
FIG. 3A is a view for explaining a generation of a control signal according to a modification of the embodiment.

In addition, as illustrated in FIG. 3A, a portion of LF output from the first radio-frequency power supply 48 may be input to a phase shift circuit 210 provided in the controller 200, and a radio-frequency voltage obtained by shifting the phase of LF by a predetermined amount with the phase shift circuit 210 may be applied to the edge ring 24.

Instead of shifting the phase of LF by a predetermined amount with the phase shift circuit 210, a radio-frequency voltage having an arbitrary delay and an arbitrary width may be generated from the waveform of LF output from the first radio-frequency power supply 48, and the generated radio-frequency voltage may be applied to the edge ring 24.

However, the above-described method of generating a control signal is an example, and the present disclosure is not limited thereto. Without being limited to the circuit of the controller 200 illustrated in FIG. 2, another hardware or software may be used as long as the hardware or software is capable of generating a control signal for applying at least one of the negative DC voltage and the radio-frequency voltage in a partial time period within each period of the given periodically varying parameter. In a case of the DC voltage, for example, a control signal for alternately repeating the On/Off of the DC voltage may be generated.

The amplifier of the first radio-frequency power supply 48 amplifies the amplitude of a modulation signal (amplitude modulation (AM)) of LF of 400 kHz, and supplies the LF to the lower electrode. The amplifier of the second radio-frequency power supply 90 amplifies the amplitude of a modulation signal of HF of 100 MHz, and supplies the HF to the lower electrode.

From the given synchronization signal, the signal generation circuit 102 may generate a control signal for applying the negative DC voltage in a partial time period within each period of the periodically varying parameter measured in the transmission path of the bias power and controlling the absolute value of the negative DC voltage to be alternately repeated between High and Low, and may give the generated control signal to the variable DC power supply 50. From the given synchronization signal, the signal generation circuit 102 may generate a control signal for applying the radio-frequency voltage in a partial time period within each period of the periodically varying parameter measured in the transmission path of the bias power and controlling the radio-frequency voltage to be alternately repeated between High and Low, and may give the generated control signal to the second radio-frequency power supply 90.

Figure 3B:
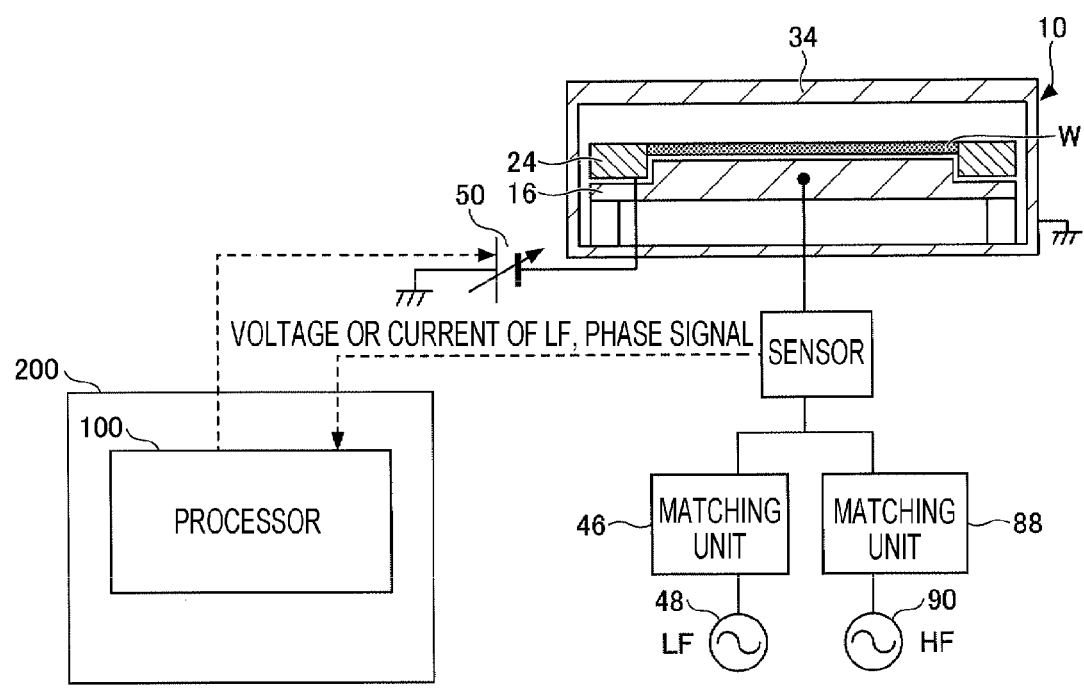
FIG. 3B is a view illustrating an example where a control is performed with a phase signal of a sensor attached to a power feeding system according to the embodiment.
Figure 3C:
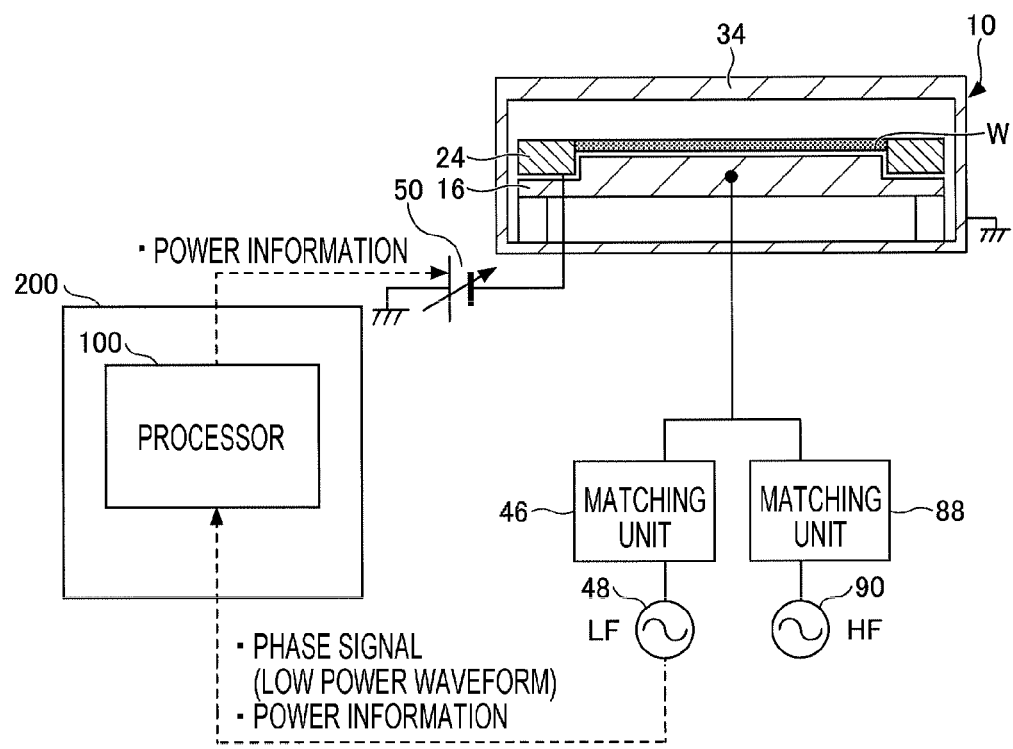
FIG. 3C is a view illustrating an example where a control is performed with a signal synchronized with a period of a radio-frequency or a pulse wave of a bias power according to the embodiment.

For example, FIGS. 3B and 3C are examples where any one of a voltage, current, and electromagnetic field measured in the transmission path of the bias power (power feeding system) is set as the "reference electrical state." For example, in FIG. 3B, the processor 100 inputs any one of a voltage or current of HF, a voltage or current of LF, a phase signal of HF, and a phase signal of LF from a sensor such as a VI probe attached to the transmission path. The processor 100 alternately applies the first state and the second state of the DC voltage in synchronization with the phase within one period of the reference electrical state that represents the input voltage or current of HF, voltage or current of LF, phase signal of HF, or phase signal of LF.

The processor 100 may generate a signal synchronized with the period of the radio-frequency or pulse wave of the bias power output from the first radio-frequency power supply 48, rather than using the signal from the sensor. In this case, the state of the generated signal may be set as the reference electrical state. Further, the process of measuring the reference electrical state in the power feeding system of the bias power may be omitted. For example, in FIG. 3C, the processor 100 inputs a phase signal of LF (low power waveform) or a signal related to information of the bias power from the first radio-frequency power supply 48, and generates a signal synchronized with the period of the radio-frequency or pulse wave of the bias power based on the input signal. The processor 100 outputs the generated signal to the variable DC power supply 50. Based on this signal, the variable DC power supply 50 alternately applies the first state and the second state of the source power.

Figure 3D:
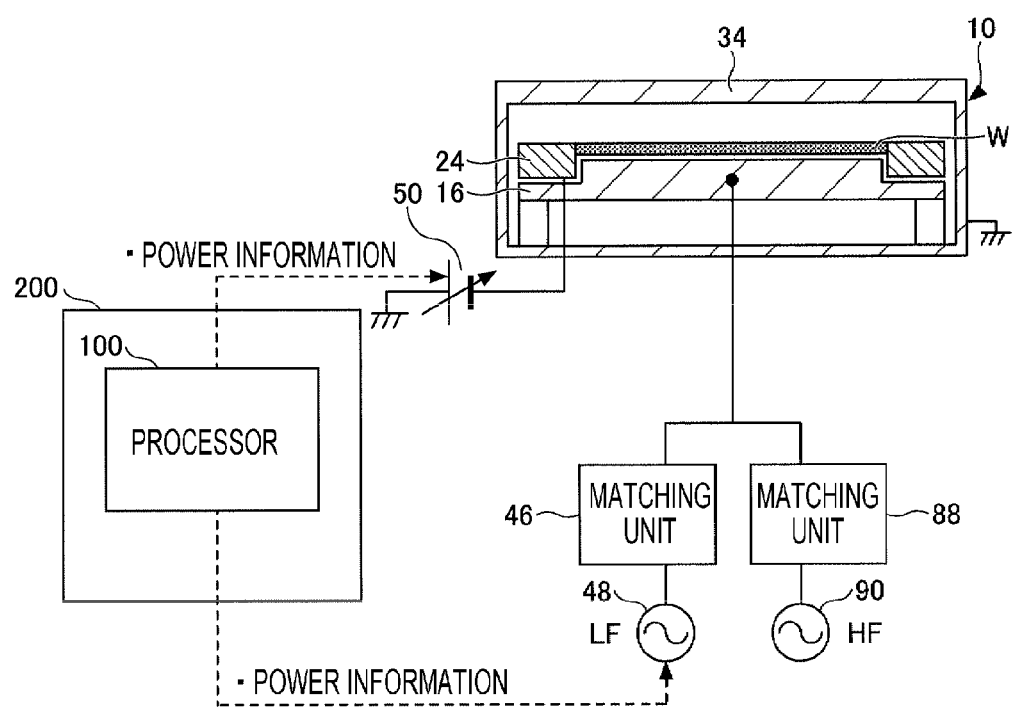
FIG. 3D is a view illustrating an example where a control is performed with a signal synchronized with a period of a radio-frequency or a pulse wave of a bias power according to the embodiment.

In addition, as illustrated in FIG. 3D, the processor 100 may generate a signal for controlling the first radio-frequency power supply 48 and generate a signal synchronized with the generated signal, so as to generate a signal synchronized with the period of the radio-frequency or pulse wave of the bias power output from the first radio-frequency power supply 48, rather than using the signal from the first radio-frequency power supply 48. In this case, the processor 100 not only generates the signal of LF for controlling the first radio-frequency power supply 48 (see, e.g., FIG. 5A), but also generates the signal of the DC voltage signal synchronized with the generated signal as illustrated in, for example, FIG. 5A. The processor 100 transmits the generated signal of LF to the first radio-frequency power supply 48, and transmits the generated signal of the DC voltage to the variable DC power supply 50. The first radio-frequency power supply 48 outputs the bias power based on the signal of LF. The variable DC power supply 50 alternately applies the first state and the second state of the DC voltage based on the signal of the DC voltage. The generated signal of LF and the generated signal of the DC voltage include power information.

[Plasma Potential/Wafer Potential and Sheath Thickness]

Figure 4A:
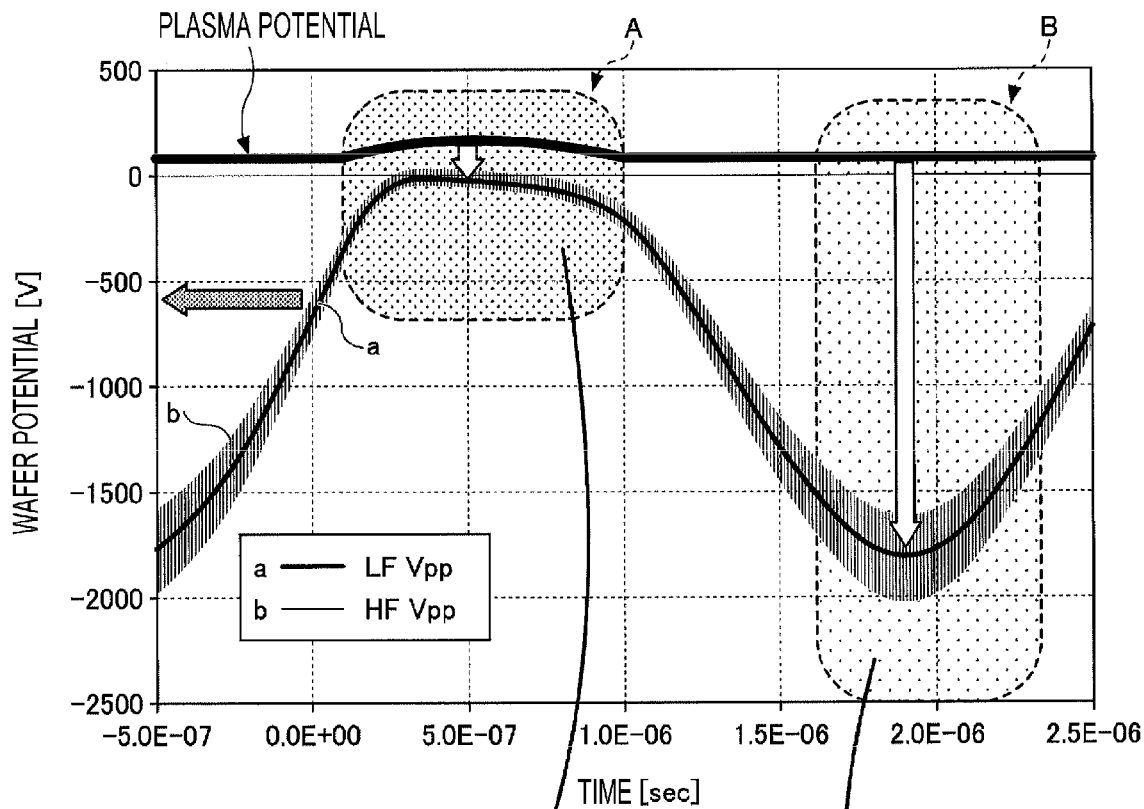
FIGS. 4A to 4C are views for explaining a relationship between a plasma potential/a wafer potential and a sheath thickness.
Figure 4B:
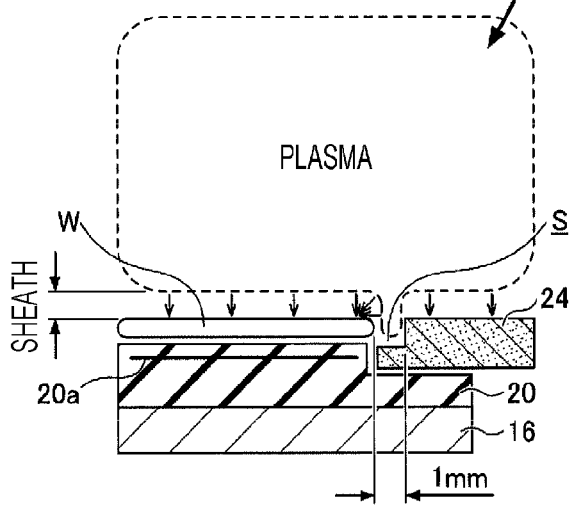
Figure 4C:
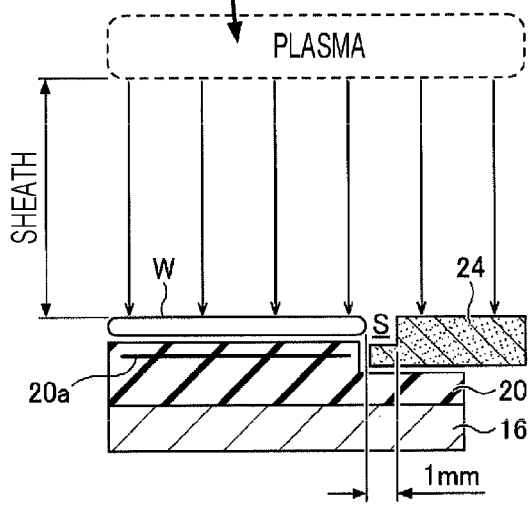

FIGS. 4A to 4C are views for explaining a relationship between a plasma potential/a wafer potential and a sheath thickness. The wafer potential is substantially the same as the electrode potential. In FIG. 4A, the horizontal axis represents time, and the vertical axis represents the potential of the wafer W. FIGS. 4A to 4C represent a result obtained by actually measuring the potential of the wafer W when an HF power with a frequency of 100 MHz and an LF power with a frequency of 400 kHz are applied to the stage 16. The potential of the wafer W is basically represented by the amplitude of LF Vpp of the low frequency of 400 kHz as indicated by the line "a," and vibrates with the width of HF Vpp indicated by the line "b" when the HF power with the radio-frequency of 100 MHz is superimposed on the LF power.

The plasma potential is slightly higher than the highest potential in the processing container 10. The potential of the wafer is determined mainly by the LF of the low frequency, in the LF and the HF that are superimposed and applied to the stage 16, and it may be understood that the potential difference between the plasma potential and the wafer W potential becomes small in or in the vicinity of the region where the wafer W potential has a positive phase, that is, the potential of the wafer W is positive as indicated by the region A, and becomes very large in the region where the wafer W potential is negatively large, that is, the potential of the wafer W is negatively deep as indicated by the region B.

The sheath thickness is obtained by Equation (1) and is substantially proportional to the potential difference between the plasma potential and the wafer W potential.

$$\text{Sheath Thickness} = \frac{\sqrt{2}}{3}\left(\frac{\varepsilon_0 \cdot Te}{e \cdot Ne}\right)\left(\frac{2V_{dc}}{Te}\right)^{\frac{3}{4}} \quad \text{[Equation 1]}$$

Here, Vdc is a self-bias, Te is a plasma temperature, Ne is a plasma density, ε0 is a dielectric constant of vacuum, and "e" is an elementary electrical charge.

Thus, when the wafer W potential has a positive phase, the potential difference between the plasma potential and the wafer W potential and the potential difference between the plasma potential and the potential of the edge ring 24 become small, and the thickness of sheath above the wafer W and the edge ring 24 becomes thin as illustrated in FIG. 4B.

As a result, plasma enters a gap S formed between the edge of the wafer W and the edge ring 24, and a distortion occurs in the sheath. Thus, in the gap S, ions close to the outer periphery of the wafer W are incident obliquely toward the inner side of the wafer W at the edge of the wafer W due to the distortion of sheath.

Meanwhile, when the wafer W potential has a negatively large phase, that is, in the region B, the potential difference between the plasma potential and the wafer W potential and the potential difference between the plasma potential and the potential of the edge ring 24 become large, and the thickness of sheath above the wafer W and the edge ring 24 becomes thick as illustrated in FIG. 4C.

Accordingly, when the wafer W potential has a negatively large phase, the distortion of sheath does not occur in the gap S, and ions are sufficiently accelerated in the sheath and are vertically incident on the wafer W at the edge of the wafer W as well.

As described above, at the edge of the wafer W, since the presence/absence of the distortion of sheath in the gap S are periodically repeated, the oblique incidence of ions and the vertical incidence of ions on the wafer W are periodically and continuously repeated according to the wafer W potential, and as a result, it is believed that a hole at the edge of the wafer W is formed in an elliptical shape.

In the meantime, the distortion of sheath does not occur when no gap S exists. However, wafers W are carried one by one, and the position of each wafer W is slightly shifted each time the wafer W is placed on the stage 16. Accordingly, the gap S needs to be provided between the wafer W and the edge ring 24, so as to prevent the wafer W from being in contact with the edge ring 24 even when the position of the wafer W is shifted.

In addition, in recent years, the LF has been lowered from several MHz to several hundred kHz, and actually, the roundness of a hole collapses or tilting occurs at the edge of the wafer W. That is, when the LF is about several MHz, ions are heavy even though the sheath thickness varies according to the period of the LF. Hence, the acceleration direction of ions is not clearly distinguished, the ions are incident with substantially constant energy due to the self-bias Vdc of the LF, and the incidence angle of the ions changes less.

Meanwhile, for example, when the LF is as low as several hundred kHz, the acceleration direction of ions is clearly distinguished at a timing when the sheath is thick and at a timing when the sheath is thin, the change of the incidence angle of ions is periodically and continuously repeated when the wafer potential or electrode potential is positive and when the wafer potential or electrode potential is negative, and a hole at the edge of the wafer W is easily formed in an elliptical shape.

Thus, in the plasma processing apparatus 1 according to the present embodiment, the negative DC voltage is applied to the edge ring 24 according to the wafer potential or electrode potential, and the thickness of sheath in the edge ring 24 is controlled. As a result, a hole with high roundness is formed in the wafer W, and the occurrence of tilting is prevented so that the etching shape may become vertical.

[Method of Applying Negative DC Voltage and Effects Thereof]

Figure 5A:
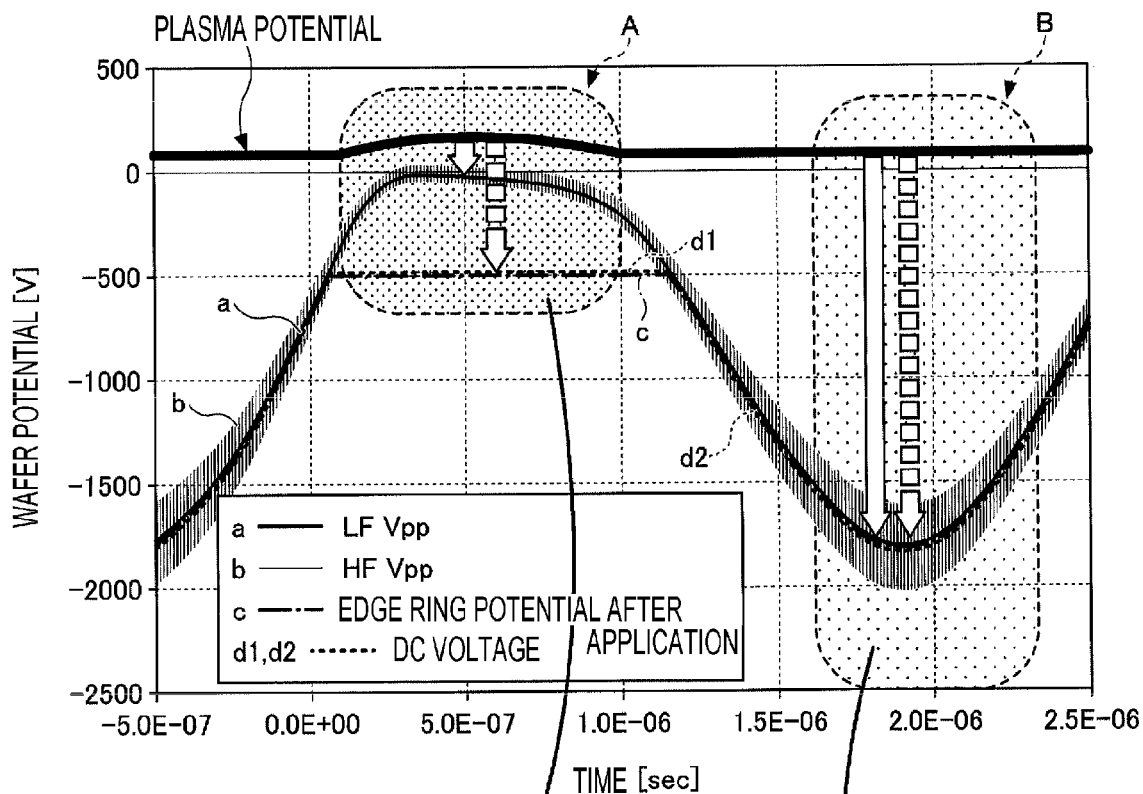
FIGS. 5A to 5C are views illustrating an example of a method of applying a negative DC voltage and effects thereof according to the embodiment.
Figure 5B:
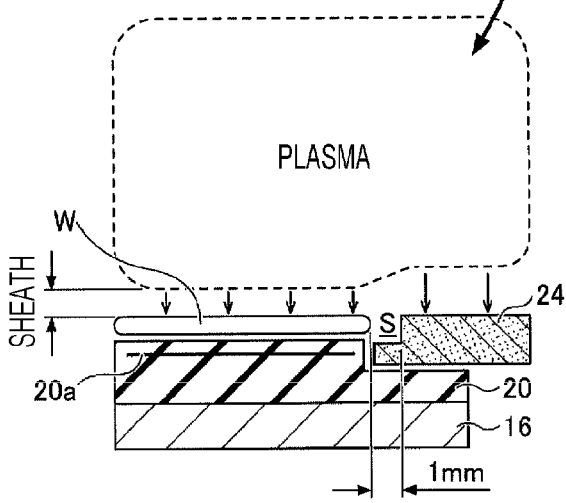
Figure 5C:
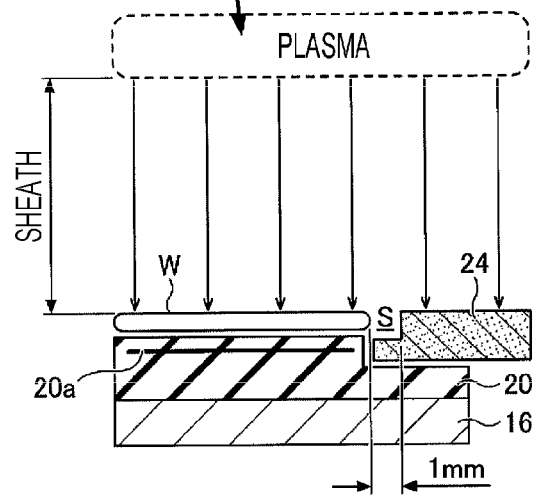

Descriptions will be made on a method of applying the negative DC voltage and effects thereof according to the present embodiment with reference to FIGS. 5A to 5C. FIGS. 5A to 5C are views illustrating an example of the method of applying the negative DC voltage according to the embodiment, and an example of effects thereof. In FIG. 5A, the horizontal axis represents time, and the vertical axis represents the potential of the wafer W. FIGS. 5A to 5C, 6, and 8 illustrate that HF is superimposed on LF which has a deep Vdc and vibrates with large Vpp, and the HF vibrates with small Vpp.

The controller 200 controls the negative DC voltage to be applied to the edge ring 24 according to a timing when the electrode potential is positive. Hereinafter, the control of the DC voltage to be applied to the edge ring 24 will be described.

As an example of the method of controlling the DC voltage to be applied to the edge ring 24, the controller 200 may apply the negative DC voltage to the edge ring 24 in synchronization with a timing when the electrode potential is positive. In addition, the controller 200 may apply the negative DC voltage to the edge ring 24 at a timing when the electrode potential is around zero. In addition, the controller 200 may apply the negative DC voltage to the edge ring 24 at a timing when the electrode potential is closer to zero than the self-bias Vdc. In addition, the controller 200 may apply the negative DC voltage to the edge ring 24 at a timing other than a time zone when the electrode potential is negatively deepest. In addition, the controller 200 may control the negative DC voltage such that plasma does not enter the gap S between the periphery of the wafer W and the edge ring 24 or a hole is formed in a complete circle by empirical rules.

The sheath becomes thin when the electrode potential is positive. Accordingly, at this time, by applying the negative DC voltage (e.g., a DC voltage d1 represented in the region A of FIG. 5A) to the edge ring 24, the potential of the edge ring 24 is controlled to the potential indicated by the line "c" in FIG. 5A. As a result, at the timing of the region A where the potential difference between the wafer W potential and the plasma potential is small, the potential difference increases so that the sheath above the edge ring 24 may be made thick. That is, by applying the negative DC voltage when the electrode potential is positive or nearly positive, the sheath thickness may be increased from the state illustrated in FIG. 5B to the state illustrated in FIG. 5C. As a result, it is possible to avoid that plasma enters the gap S of the periphery of the wafer W. As a result, it is possible to avoid that ions are obliquely incident on the wafer W at the edge of the wafer W due to the distortion of sheath in the gap S, and it is possible to prevent a hole from being formed in an elliptical shape or prevent the occurrence of tilting.

However, the timing for applying the negative DC voltage is not limited to the timing when the electrode potential is positive. The negative DC voltage may be applied at other timings, for example, a timing when the electrode potential includes a positive peak, a timing that includes the timing when the electrode potential is positive and negative timings of the electrode potential before and after the timing when the electrode potential is positive, a timing other than a timing when the electrode potential is around zero or a timing when the electrode potential is deeper than the self-bias Vdc, and a time having an arbitrary delay and an arbitrary width from a timing when the electrode potential is positive or negative.

In addition, as the means for increasing the sheath thickness, instead of continuously applying the negative DC voltage, the timing for supplying the negative DC voltage or the like may be controlled according to a pulse-type power corresponding to the peak of the LF voltage (hereinafter, also referred to as an "LF pulse"). Additionally, the HF power may be controlled to increase.

Figure 7:
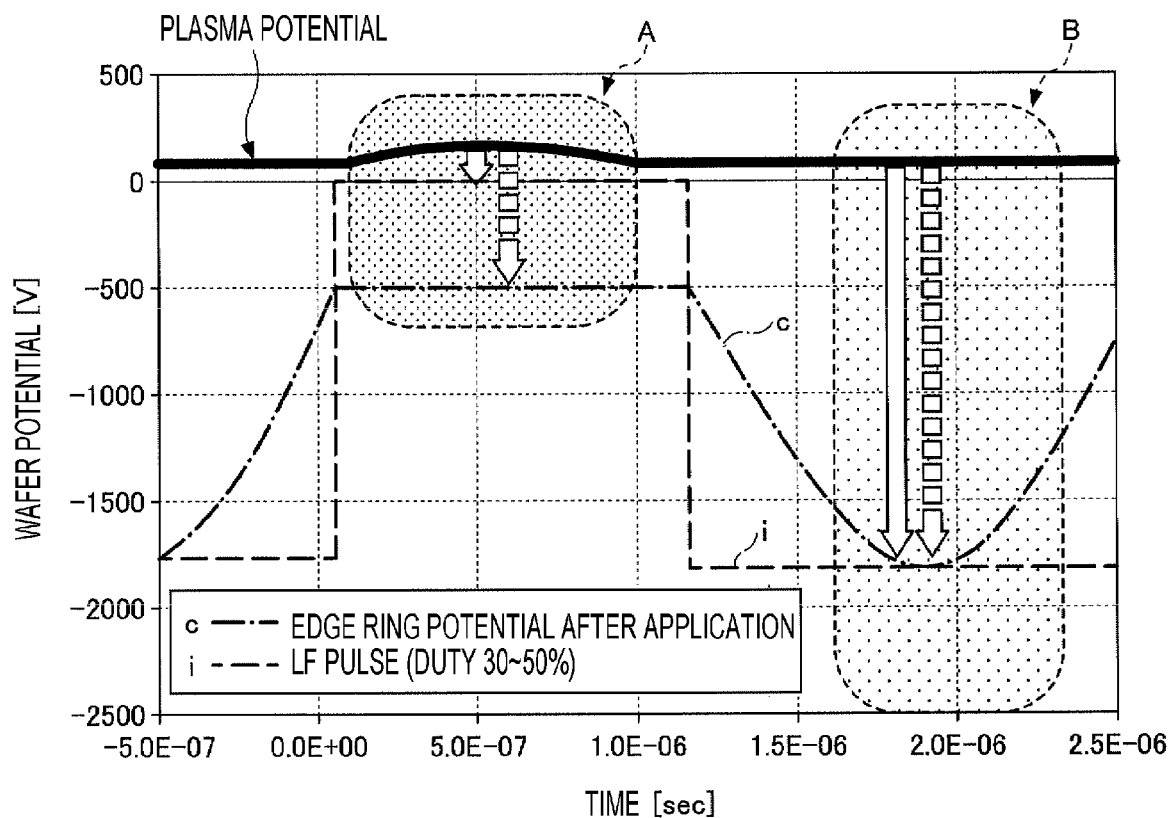
FIG. 7 is a view illustrating an example of the method of applying a negative DC voltage according to the embodiment.

FIG. 7 illustrates a method of controlling the negative DC voltage to be applied to the edge ring 24 according to an LF pulse "i." For example, as illustrated in FIG. 7, the negative DC voltage to be applied to the edge ring 24 may be controlled according to the LF pulse "i" having a duty of 30% to 50%. For example, when the LF pulse "i" is 0, the negative DC voltage may be applied to the edge ring 24, and when the LF pulse "i" is not 0, applying the negative DC voltage may be stopped, the negative DC voltage may still be continuously applied, or the negative DC voltage may be applied to reach the voltage of LF Vpp indicated by the curve "c" illustrated in FIG. 7.

As a result, the sheath may be controlled to become thick even in the region A where the sheath above the wafer W is thin, so that a hole with high roundness may be formed at the edge of the wafer W as well, the occurrence of tilting may be prevented, and thus, the etching shape may become vertical. In addition, the negative LF pulse "i" having the duty of 30% to 50% refers to a waveform in which the ratio of time when the voltage is zero is 30% to 50% in one period.

Figure 6:
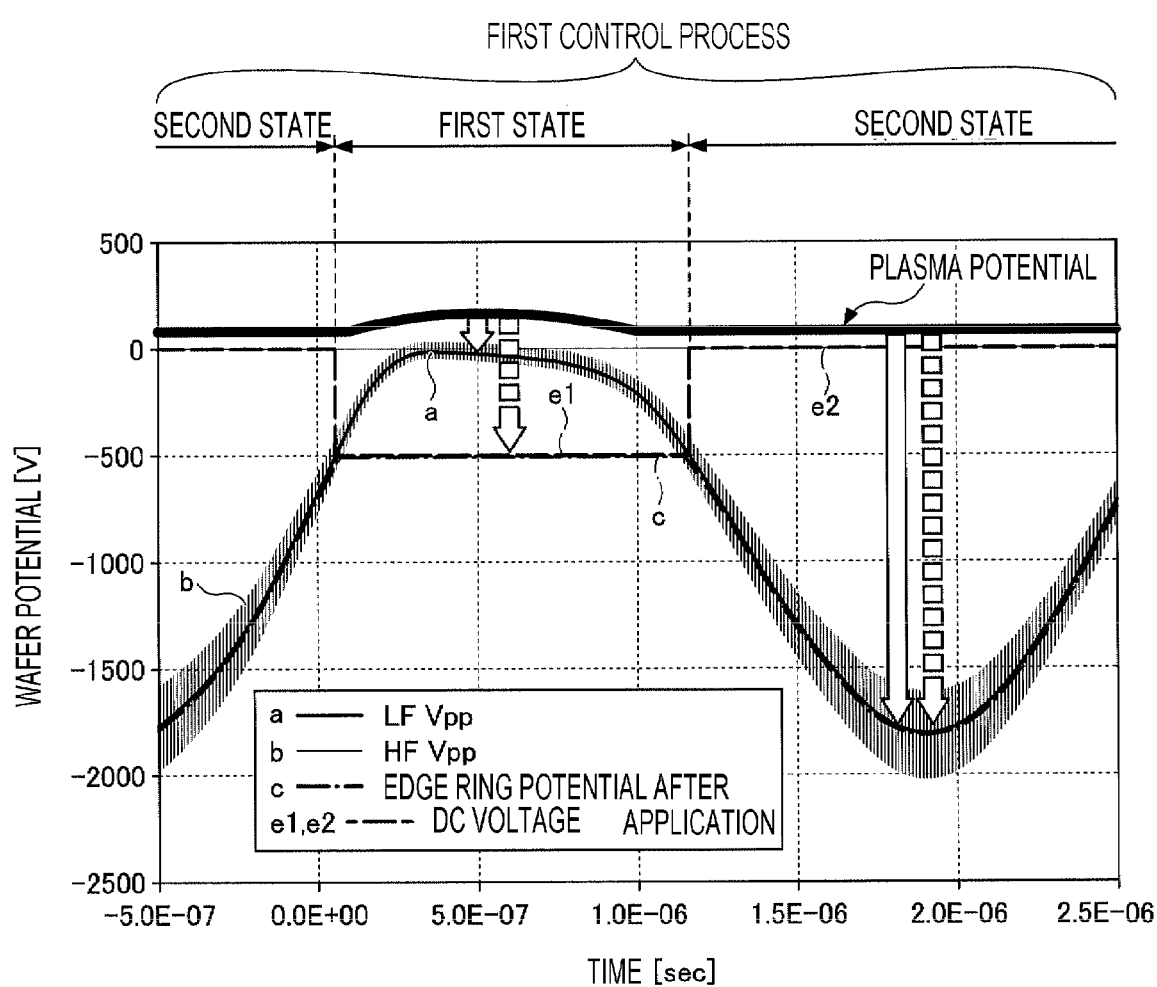
FIG. 6 is a view illustrating an example of the method of applying a negative DC voltage according to the embodiment.

While the negative DC voltage may be continuously applied to the edge ring 24, applying the negative DC voltage to the edge ring 24 may be turned On/Off. In this case, as an example of a condition, when a DC power supply is capable of carrying current only in one direction in one quadrant or when a diode or the like is attached to the output of a DC power supply such that current is carried only in one direction, a negative DC voltage e1 may be applied at a timing when it is desired to make the wafer potential negatively larger than the plasma potential, and a DC voltage e2 may be controlled to zero at the other timings, as illustrated in FIG. 6. As for the negative DC voltage applied in this manner, the first voltage value e1 of the first state is smaller than the second voltage value e2 of the second state.

In addition, in a case where a power supply is capable of carrying current only in one direction, current does not flow even when a negative DC voltage with a potential shallower than the plasma potential is applied, and the effect in making the sheath thick is not obtained. In a case where a power supply is a four quadrant power supply, the direction of each of voltage and current is bidirectional, and thus, the DC voltage may be applied according to the wafer W potential without cutting off the DC voltage, in order to protect the power supply. As illustrated in FIG. 5A, the negative DC voltage d1 may be applied at a timing when it is desired to make the wafer potential negatively larger than the plasma potential, and a negative DC voltage d2 may be applied at the other timings to reach the voltage of LF Vpp of the curve "a" illustrated in FIG. 5A. In this case as well, as for the applied negative DC voltage, the first voltage value d2 of the first state is smaller than the second voltage value d1 of the second state.

(Other Examples of Method of Applying Negative DC Voltage)

The thickness of sheath above the wafer W may be measured, and the value of the negative DC voltage to be applied to the edge ring 24 may be controlled according to the measured thickness of sheath. For example, the negative DC voltage may be applied to the edge ring 24 when the thickness of sheath above the wafer W is equal to or less than a predetermined threshold value. The supply of the negative DC voltage to the edge ring 24 may be stopped when the thickness of sheath above the wafer W exceeds the threshold value.

In addition, when the thickness of sheath above the wafer W is equal to or less than the threshold value, the negative DC voltage to be applied to the edge ring 24 may be controlled to vary by stages or smoothly.

The negative DC voltage may be applied to the edge ring 24 in a time zone having an arbitrary delay and an arbitrary width from the timing when the electrode potential is positive. For example, the negative DC voltage may be applied to the edge ring 24 in a time zone that is as long as a predetermined time before and after the timing when the electrode potential is positive, or in a time zone that is as short as a predetermined time before and after the timing when the electrode potential is positive.

The DC voltage is controlled by the controller 200 using a storage medium having a program for periodically repeating the first state having the first voltage value and the second state having the second voltage value higher than the first voltage value, applying the first voltage value in a partial time period within each period of the electrode potential, and controlling the second voltage value such that the first state and the second state are continuous.

[Modifications: Method of Applying DC Voltage (Control of Tilting)]

Figure 8:
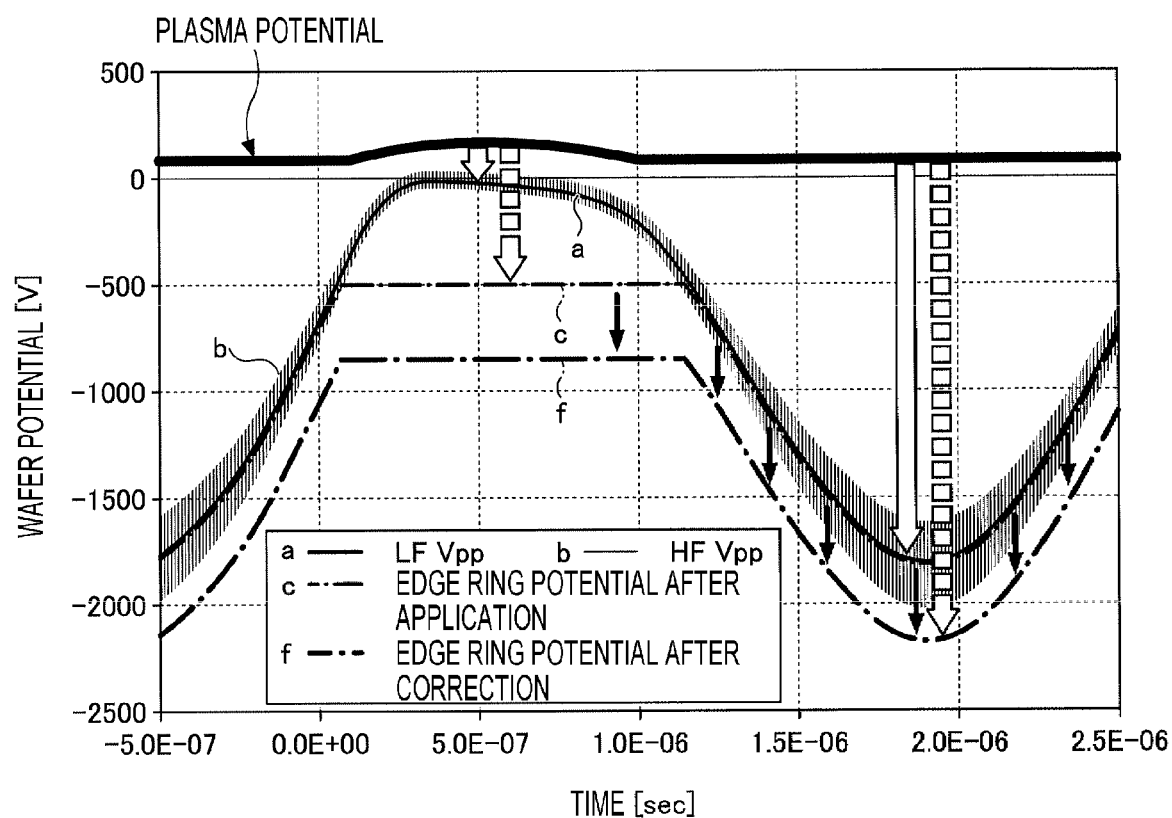
FIG. 8 is a view illustrating an example of a method of applying a negative DC voltage (control of tilting) according to a modification.
Figure 9:
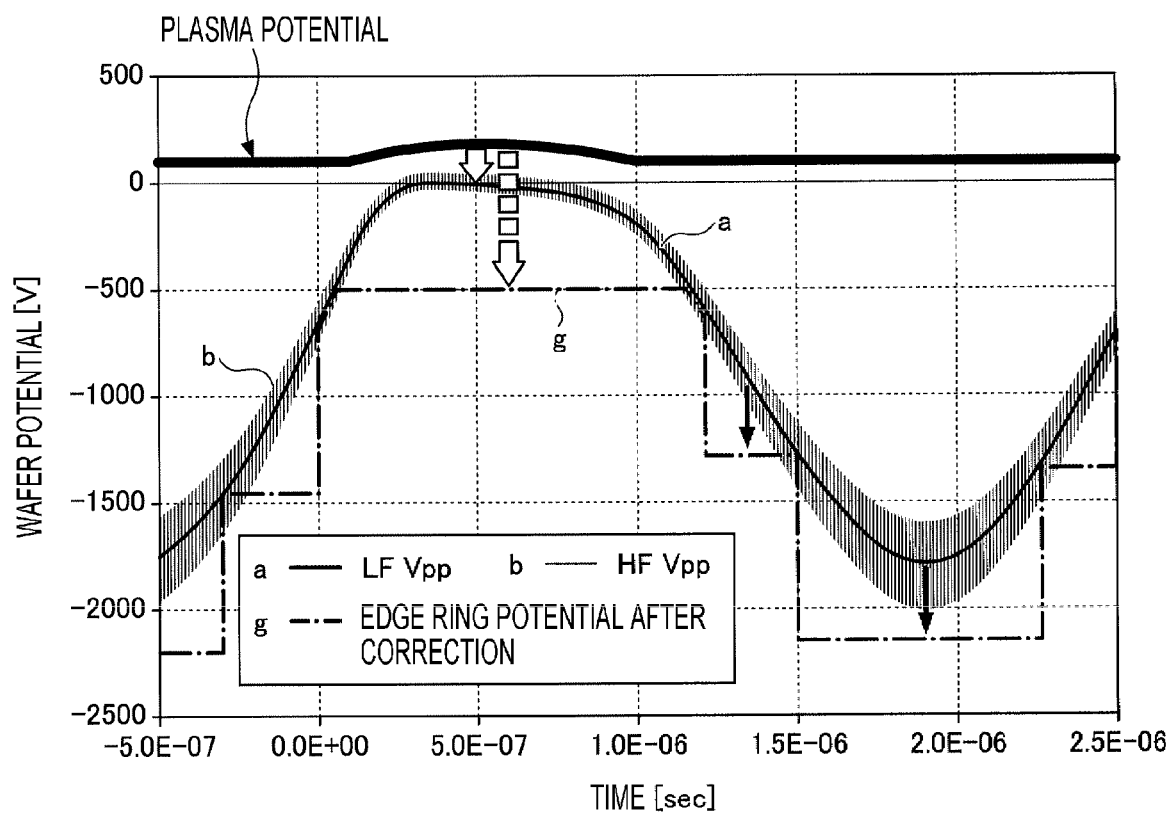
FIG. 9 is a view illustrating an example of a method of applying a negative DC voltage (control of tilting) according to a modification.

Next, descriptions will be made on a method of applying the negative DC voltage depending on the consumption of the edge ring 24, according to a modification with reference to FIGS. 8 and 9.

When a stepped difference occurs between the height of sheath of the wafer W and the height of sheath of the edge ring 24 due to the consumption of the edge ring 24, the etching shape at the edge of the wafer W does not become vertical and becomes oblique causing a tilting. In this regard, the sheath may be made thick by increasing the absolute value of the negative DC voltage to be applied to the edge ring 24 according to the consumption of the edge ring 24.

That is, in the method of applying the DC voltage to the edge ring 24 according to the modification, the negative DC voltage controlled by the method of applying the DC voltage according to the embodiment described above is corrected such that the absolute value of the negative DC voltage increases according to the degree of consumption of the edge ring 24, and the corrected negative DC voltage is applied to the edge ring 24. As a result, as illustrated in FIG. 8, the potential of the edge ring 24 after the DC voltage is applied may be changed from a potential "c" when the uncorrected negative DC voltage is applied, to a potential "f" when the negative DC voltage corrected according to the degree of consumption of the edge ring 24 is applied.

As a result, the thickness of sheath of the edge ring 24 is made thick according to the consumption of the edge ring 24, so that the thickness of sheath of the wafer W and the thickness of sheath of the edge ring 24 may be aligned. As a result, it is possible to suppress the occurrence of tilting and form a hole in a complete circle at the edge portion of the wafer W.

The controller 200 may independently correct the DC voltage in each of the case where the electrode potential is positive and the case where the electrode potential is negative. For example, the controller 200 may correct the DC voltage to be applied, to different negative values for the cases where the electrode potential is positive and negative, or may turn Off the negative DC voltage when the electrode potential is negative.

The controller 200 may correct the negative DC voltage to be controlled, by predicting the degree of consumption of the edge ring 24 based on at least one of the use time of the edge ring 24, the application time of the HF power, and the total application time of the HF power and LF power.

As the correcting method, for example, a DC voltage correction value for the use time of the edge ring 24, the application time of the HF power, or the total application time of the HF power and the LF power may be stored in advance in the memory of the controller 200. From the information stored in the memory, the controller 200 may extract a DC voltage correction amount corresponding to the consumption amount of the edge ring 24 based on the use time of the edge ring 24, the application time of the HF power, or the total application time of the HF power and the LF power, and determine a corrected DC voltage value to be applied to the edge ring 24.

Alternatively, a DC voltage correction value for the consumption amount of the edge ring 24 is stored in advance in the memory of the controller 200. The controller 200 may measure the actual thickness of the edge ring 24, extract a DC voltage correction amount corresponding to the consumption amount of the edge ring 24 based on the actual measurement value of the consumption amount of the edge ring 24 from the information stored in the memory, and determine a corrected DC voltage value to be applied to the edge ring 24.

The negative DC voltage may be controlled in multiple stages according to the electrode potential. FIG. 9 represents an example where a fixed or variable negative DC voltage is applied according to the electrode potential in each stage. In FIG. 9, three-stage different fixed DC voltages are applied according to the electrode potential (wafer potential). The "g" represents an example where the three-stage negative DC voltages are applied by stages to the edge ring 24. The negative DC voltages may be smoothly applied to the edge ring 24 according to the electrode potential.

As described above, according to the plasma processing apparatus 1 and the DC applying method in the present embodiment, the timing for applying the DC voltage or the like is controlled according to the electrode potential, so that it is possible to suppress the formation of a hole in an elliptical shape or the occurrence of tilting at the edge of the wafer W.

[Control Method]

As described above, the control method of the parallel flat plate type plasma processing apparatus 1 according to the embodiment includes a process of supplying the bias power to the stage 16 on which the wafer W is placed, and a process of supplying the negative DC voltage to the edge ring 24, and a process of supplying the source power to the plasma processing space.

In this control method, the negative DC voltage or the radio-frequency voltage periodically repeats the first state and the second state. As for the negative DC voltage, the first voltage value of the first state is smaller than the second voltage value of the second state. As for the radio-frequency voltage, the first voltage value of the first state is larger than the second voltage value of the second state.

Further, the present control method includes a first control process of applying the first state in a partial time period within each period of the periodically varying parameter measured in the transmission path of the bias power, and applying the second state continuously with the first state.

The first state and the second state are not limited to the state where the DC voltage to be applied to the edge ring is controlled in the On/Off manner, and includes a state where the absolute value of the voltage value is controlled to High/Low.

Modifications 1-1 to 1-4

Next, descriptions will be made on a control method of the plasma processing apparatus 1 according to Modifications 1-1 to 1-4 of the embodiment. In Modifications 1-1 to 1-4, a control is performed to intermittently stop any one or both of the bias power and the DC voltage. FIGS. 10A to 10D are timing charts illustrating the control method according to Modifications 1-1 to 1-4 of the embodiment.

Figure 10A:
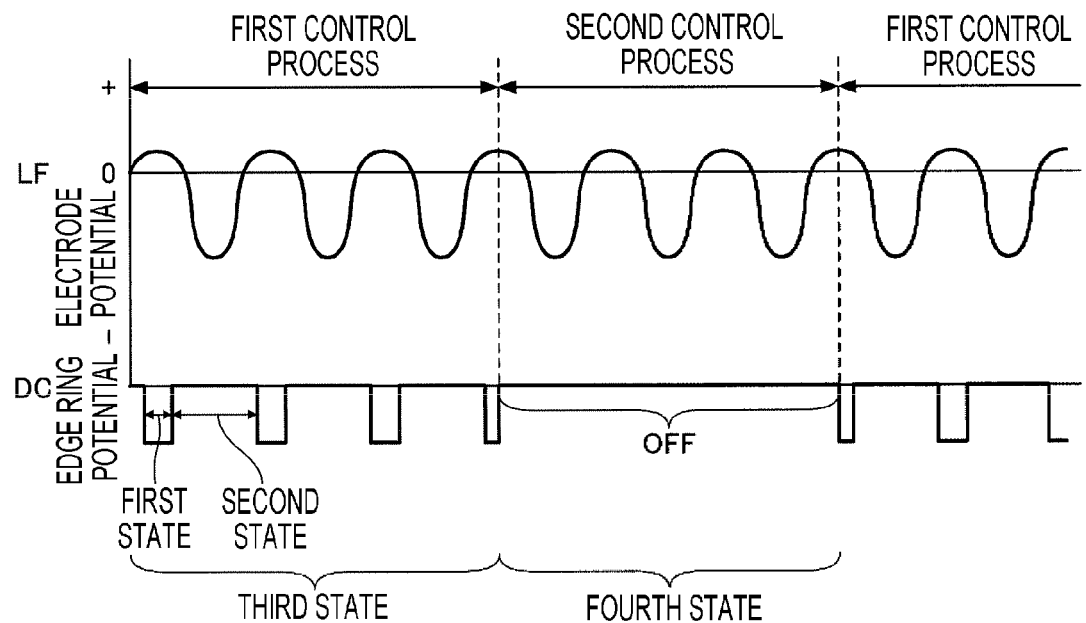
FIG. 10A is a timing chart illustrating a control method according to Modification 1-1 of the embodiment.

Modification 1-1 of FIG. 10A includes a second control process of intermittently stopping the DC voltage in an independent period from the period of the periodically varying parameter that is represented by the LF voltage as an example, in addition to the first control process. The first control process and the second control process are repeatedly performed.

In Modification 1-1, the LF voltage is applied in the same period in the first control process and the second control process. Meanwhile, as for the DC voltage, the first state and the second state are alternately repeated one or more times in the first control process, and intermittently stopped in the second control process, that is, between first control processes.

In the first control process and the second control process, the frequency of LF may be, for example, 0.1 Hz to 100 kHz. In Modification 1-1 of FIG. 10A to Modification 1-4 of FIG. 10D, the DC voltage or the radio-frequency voltage is applied in a partial time period when the periodically varying parameter that is the electrode potential as an example includes a positive value, such that the potential of the edge ring becomes the first state, and the second state is applied continuously with the first state. The DC voltage is a negative value, and the first voltage value of the first state is smaller than the second voltage value of the second state.

Figure 10B:
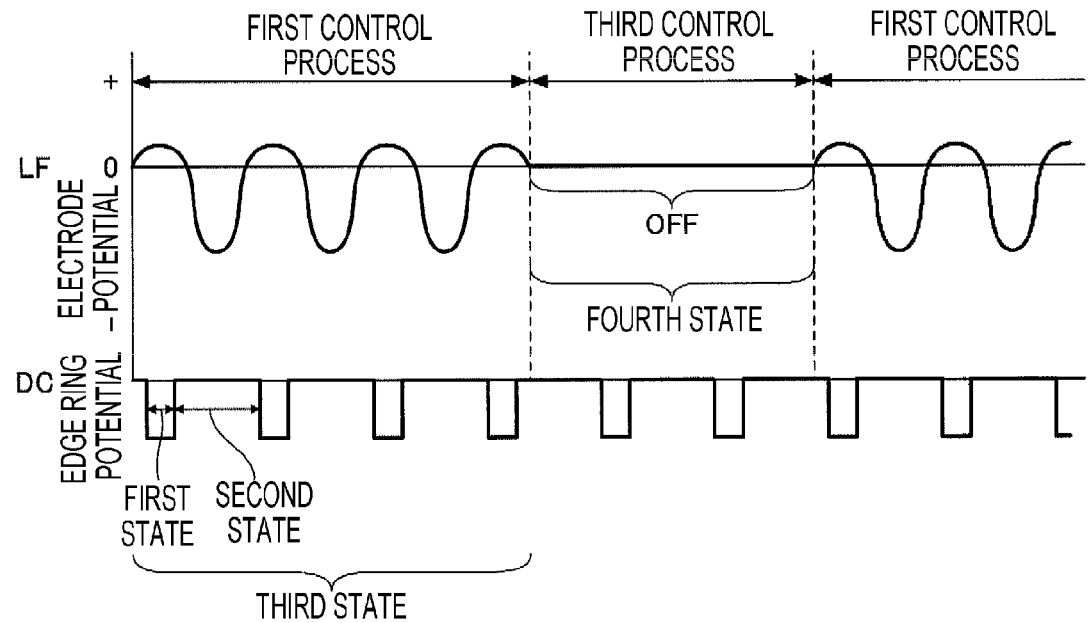
FIG. 10B is a timing chart illustrating a control method according to Modification 1-2 of the embodiment.
Figure 10C:
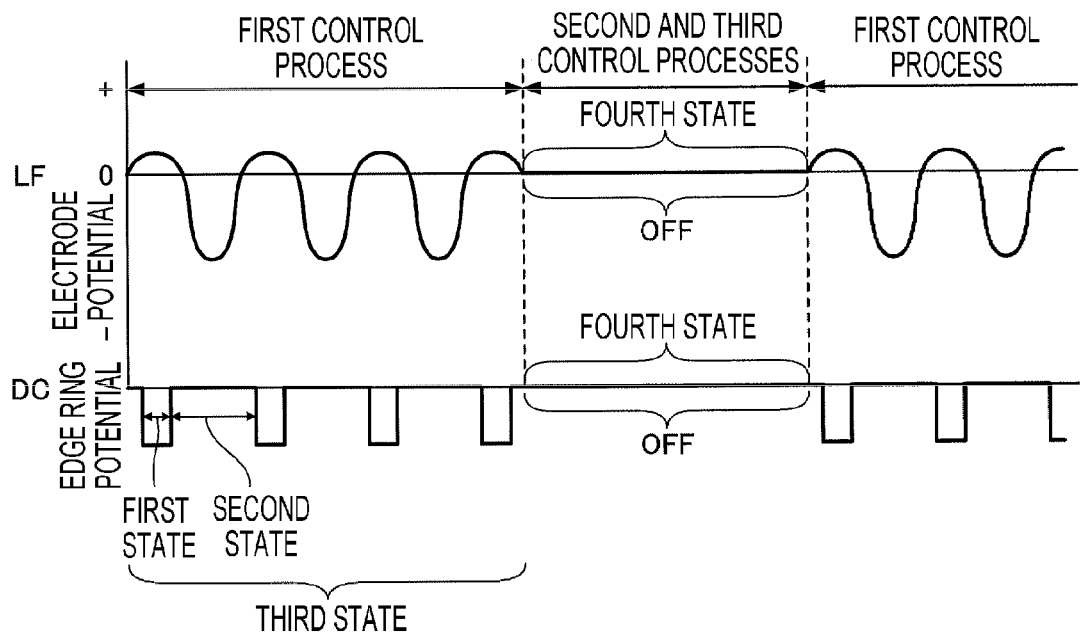
FIG. 10C is a timing chart illustrating a control method according to Modification 1-3 of the embodiment.
Figure 10D:
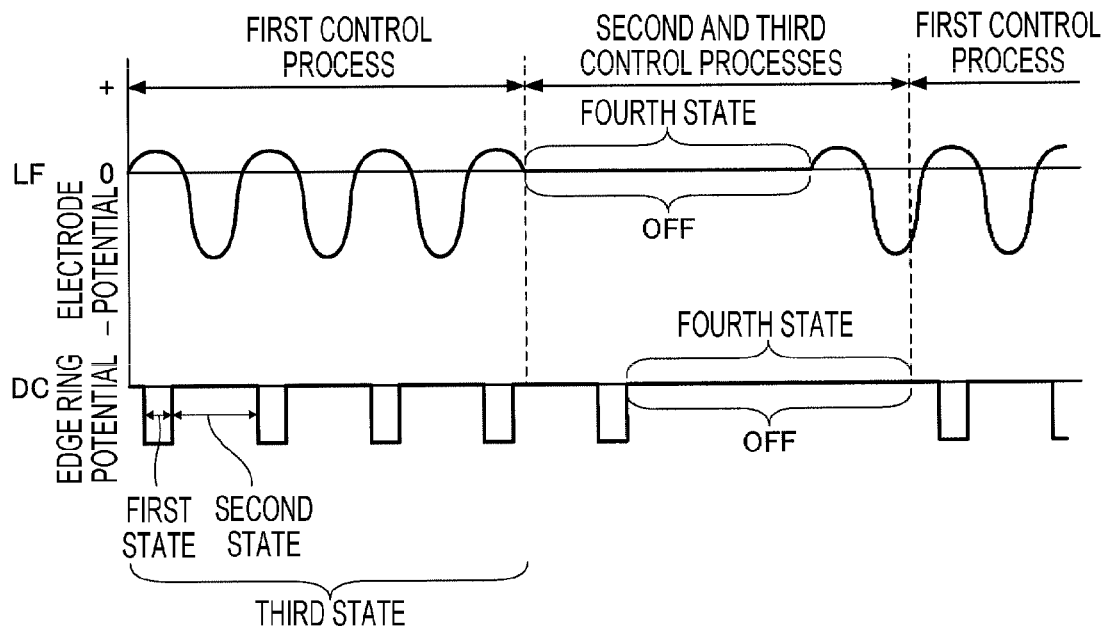
FIG. 10D is a timing chart illustrating a control method according to Modification 1-4 of the embodiment.

In Modification 1-1 of FIG. 10A to Modification 1-4 of FIG. 10D, the first state of the DC voltage has a negative voltage value, and the second state is zero. In addition, the duty ratio of the DC voltage (=fourth state/(third state+fourth state)) may fall in a range of 1% to 99%.

A predetermined radio-frequency voltage (hereinafter, also referred to as an "RF voltage") may be supplied to the edge ring 24. In this case, the RF voltage may be supplied from the second radio-frequency power supply 90 to the edge ring 24, or an RF power supply may be separately provided in the stage 16 to apply the RF voltage. As for the RF voltage, the first voltage value of the first state is larger than the second voltage value of the second state.

In Modification 1-1 of FIG. 10A, the state where the DC voltage synchronized with the timing when the LF voltage is positive takes the first state in the first control process is an example of a third state. The state of the DC voltage that is independent from the period of the LF voltage in the second control process is an example of a fourth state which is different from the third state.

The control method according to Modification 1-2 of FIG. 10B includes a third control process of intermittently stopping the bias power (the LF voltage) in an independent period from the period of the DC voltage, in addition to the first control process which is the same as Modification 1-1. In the third control process, the state of the bias power is an example of the fourth state.

In Modification 1-2, the first control process and the third control process are repeatedly performed. In Modification 1-2, as for the DC voltage in the third control process, the first state and the second state are repeated in the same period as that in the first control process.

In addition, in the first control process, the frequency of LF may be, for example, 0.1 Hz to 100 Hz, and the duty ratio of the LF voltage (=fourth state/(third state+fourth state)) may fall in the range of 1% to 90%.

In the control method according to Modification 1-3 of FIG. 10C, the control of DC in the second control process of Modification 1-1 and the control of LF in the third control process of Modification 1-2 are performed, in addition to the first control process which is the same as Modification 1-1. That is, in Modification 1-3, the state where both the DC voltage and the bias power are intermittently stopped is an example of the fourth state.

The period for intermittently stopping the bias power and the period for intermittently stopping the DC voltage may be synchronized with each other. In this case, the periods for intermittently stopping the DC and the bias power may be the same as illustrated in FIG. 10C, or the DC may be shifted behind or in front of the bias power as illustrated in FIG. 10D.

In addition, in the third state of FIGS. 10A to 10D, the DC voltage is turned On at the partial timing when the bias power is positive. However, the present disclosure is not limited thereto. In addition, instead of periodically turning On/Off the DC voltage, the DC voltage may be controlled such that the absolute value of the DC voltage which is a negative value periodically becomes High/Low.

[Modification 2]

Figure 11:
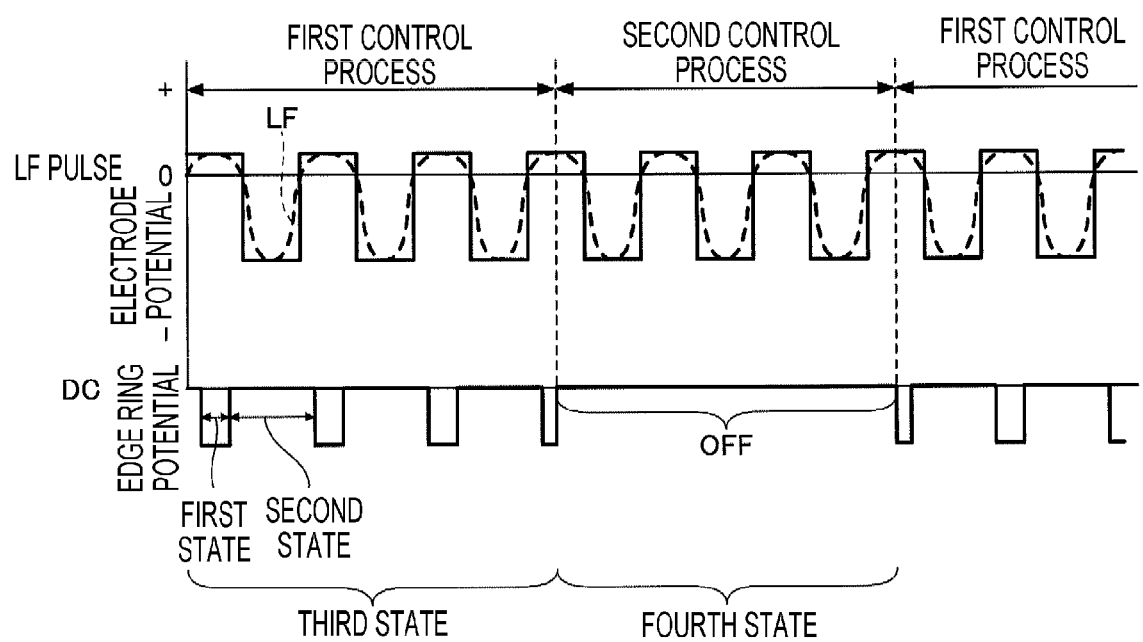
FIG. 11 is a timing chart illustrating a control method according to Modification 2 of the embodiment.

Next, descriptions will be made on a control method according to Modification 2 of the embodiment with reference to FIG. 11. FIG. 11 is a timing chart illustrating the control method according to Modification 2 of the embodiment.

For example, in the control method according to Modification 2, the LF pulse is applied to the stage 16 as illustrated in FIG. 11. The positive value of the LF pulse matches the positive peak of the LF voltage, and the negative value of the LF pulse matches the negative peak of the LF voltage.

In this case, in the control method according to Modification 2, the negative DC voltage or the radio-frequency voltage periodically repeats the first state and the second state, the first state is applied in a partial time period within each period of the LF pulse, and the second state is applied continuously with the first state. With this control method as well, the formation of a hole in an elliptical shape or the occurrence of tiling at the edge of the wafer W may be prevented.

For example, in a portion of or entire LF pulse that is zero and positive, the DC voltage may be controlled to the first voltage value of the first state, and in a portion of or entire LF pulse that is negative, the second voltage value of the second state may be controlled to be larger than the first voltage value of the first state. Then, since the LF pulse is binarized, and accordingly, the DC voltage is controlled to be binarized, the control is facilitated.

Modifications 3-1 to 3-4

Figure 12A:
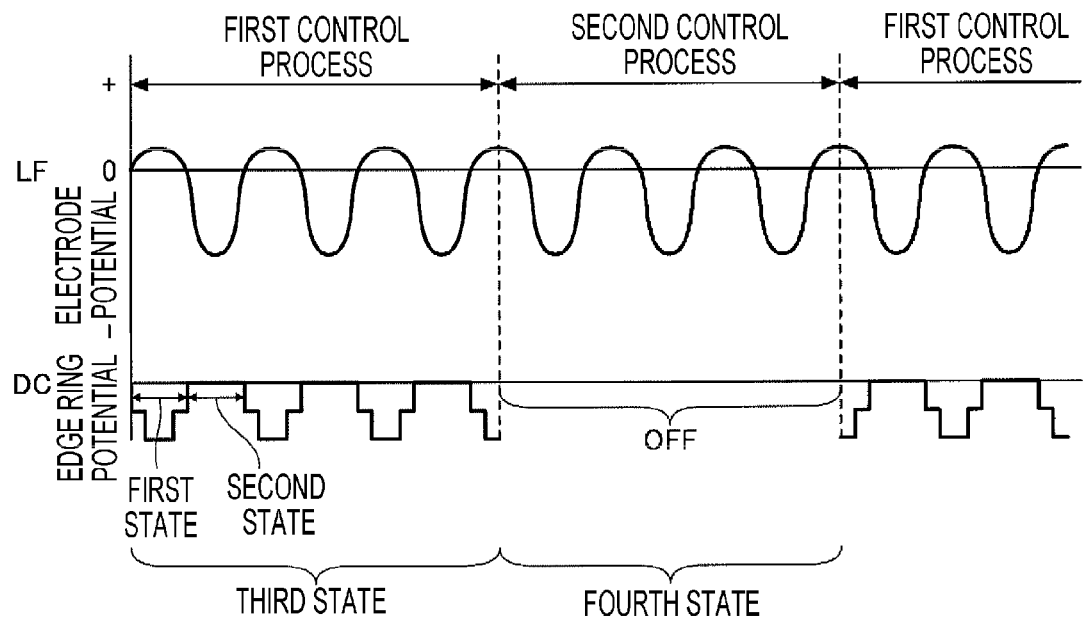
FIG. 12A is a timing chart illustrating a control method according to Modification 3-1 of the embodiment.
Figure 12B:
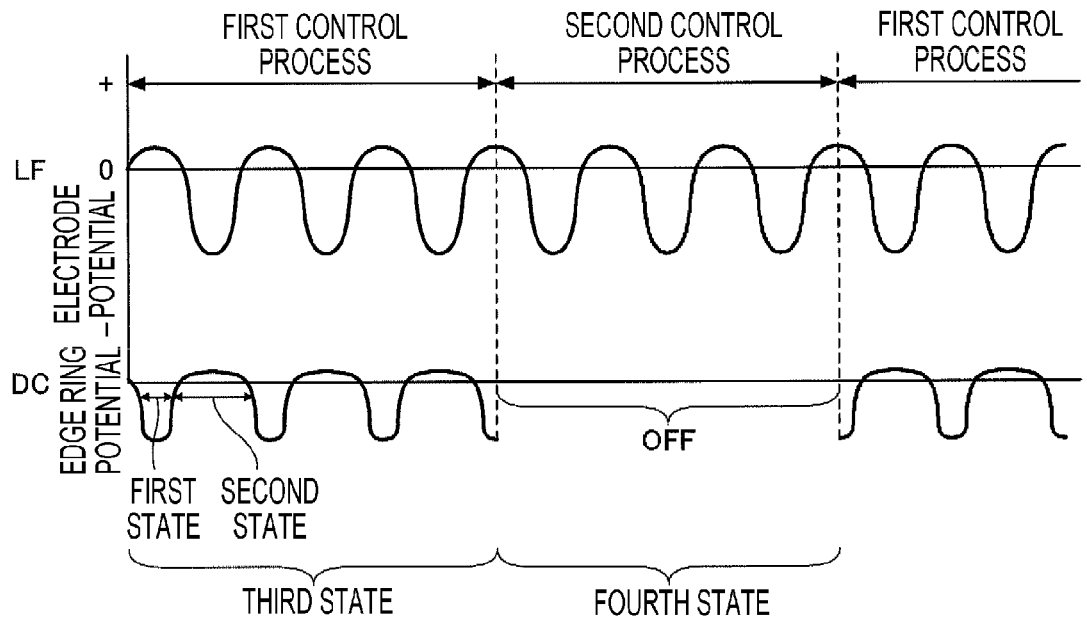
FIG. 12B is a timing chart illustrating a control method according to Modification 3-2 of the embodiment.
Figure 12C:
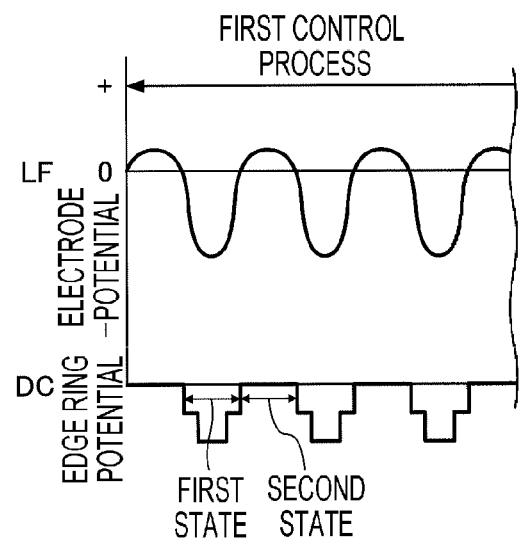
FIG. 12C is a timing chart illustrating a control method according to Modification 3-3 of the embodiment.
Figure 12D:
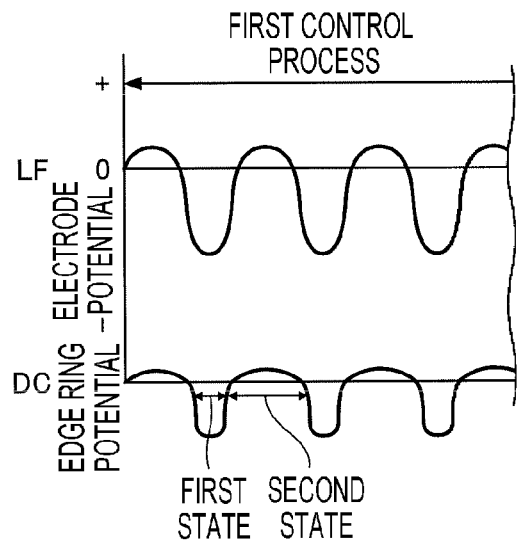
FIG. 12D is a timing chart illustrating a control method according to Modification 3-4 of the embodiment.

FIG. 12A is a timing chart illustrating a control method according to Modification 3-1 of the embodiment. FIG. 12B is a timing chart illustrating a control method according to Modification 3-2 of the embodiment. FIG. 12C is a timing chart illustrating a control method according to Modification 3-3 of the embodiment. FIG. 12D is a timing chart illustrating a control method according to Modification 3-4 of the embodiment. For example, in the control method according to Modifications 3-1 and 3-2 illustrated in FIGS. 12A and 12B, the DC voltage or the radio-frequency voltage is applied in a partial time period when the periodically varying parameter that is the electrode potential as an example includes a positive value, such that the potential of the edge ring becomes the first state, and the second state is applied continuously with the first state. In the control method according to Modifications 3-3 and 3-4 illustrated in FIGS. 12C and 12D, the DC voltage or the radio-frequency voltage is applied in a partial time period when the periodically varying parameter that is the electrode potential as an example includes a negative value, such that the potential of the edge ring becomes the first state, and the second state is applied continuously with the first state. In Modifications 3-1 illustrated in FIG. 12A and Modification 3-3 illustrated in FIG. 12C, the first state of the DC voltage has two or more first voltage values as negative values by stages. In this case as well, as for the negative DC voltage, the first voltage value of the first state is smaller than the second voltage value of the second state.

When the radio-frequency voltage is applied, the absolute value of the first voltage value of the first state is larger than the absolute value of the second voltage value of the second state. The radio-frequency voltage may be supplied from the second radio-frequency power supply 90 to the edge ring 24, or an RF power supply may be separately provided to apply the radio-frequency voltage.

In Modification 3-2 illustrated in FIG. 12B and Modification 3-4 illustrated in FIG. 12D, the first state of the radio-frequency voltage smoothly has two or more first voltage values. In any case of FIGS. 12A and 12B, the first state and the second state are periodically repeated.

For example, in Modification 3-1 illustrated in FIG. 12A and Modification 3-3 illustrated in FIG. 12C, the first state of the DC voltage has two or more first voltage values as negative values by stages. In this case as well, as for the negative DC voltage, the first voltage value of the first state is smaller than the second voltage value of the second state.

When the radio-frequency voltage is applied, the first voltage value of the first state is larger than the second voltage value of the second state. The radio-frequency voltage may be supplied from the second radio-frequency power supply 90 to the edge ring 24, or an RF power supply may be separately provided to apply the radio-frequency voltage.

In Modification 3-2 illustrated in FIG. 12B and Modification 3-4 illustrated in FIG. 12D, the first state of the radio-frequency voltage smoothly has two or more first voltage values. In any case of FIGS. 12A to 12D, the first state and the second state are periodically repeated.

As described above, the negative DC voltage or the radio-frequency voltage periodically repeats the first state and the second state. For the negative DC voltage, the first voltage value of the first state is smaller than the second voltage value of the second state, and for the radio-frequency voltage, the first voltage value of the first state is larger than the second voltage value of the second state.

The first state of the DC voltage or the radio-frequency voltage may be applied in a partial time period when the electrode potential includes a negative value. In Modifications 3-1 and 3-2, the DC voltage or the RF voltage is controlled to multiple values in the first state, so that the formation of a hole in an elliptical shape or the occurrence of tilting at the edge of the wafer W may be prevented. In addition, the DC voltage and the RF voltage in the first state according to each modification may be values corrected according to the degree of consumption of the edge ring 24.

The frequency of the RF voltage supplied to the edge ring 24 may be higher than the frequency of the bias power. Descriptions will be made on an appropriate value of the frequency of RF when the RF voltage is applied to the edge ring 24 with reference to FIGS. 13, 14A, 14B, and 15A to 15C. FIGS. 13, 14A, 14B, and 15A to 15C are views illustrating an example of the frequency of RF and the potential difference between the wafer W and the edge ring 24 according to the embodiment.

Figure 13:
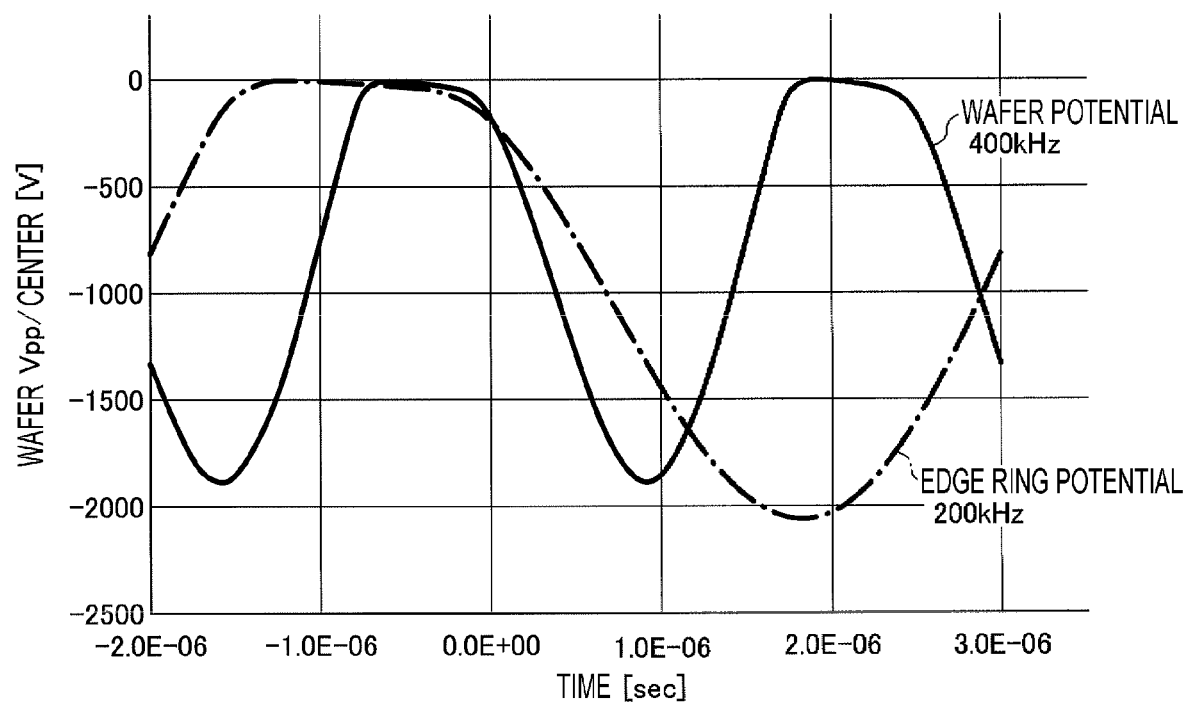
FIG. 13 is a view illustrating an example of a frequency of RF and a potential difference between a wafer and an edge ring according to the embodiment.

As illustrated as an example in FIG. 13, when an RF voltage with a lower frequency (200 kHz) than the frequency of the bias power (400 kHz) is applied to the edge ring 24, various potential differences occur between the potential of the wafer W and the potential of the edge ring 24, and accordingly, the sheath thickness of the wafer W and the sheath thickness of the edge ring 24 vary largely in the radial direction. Thus, when the RF voltage with the frequency lower than the frequency of the bias power is applied to the edge ring 24, the etching shape in the vicinity of the edge of the wafer W may be deteriorated.

Figure 14A:
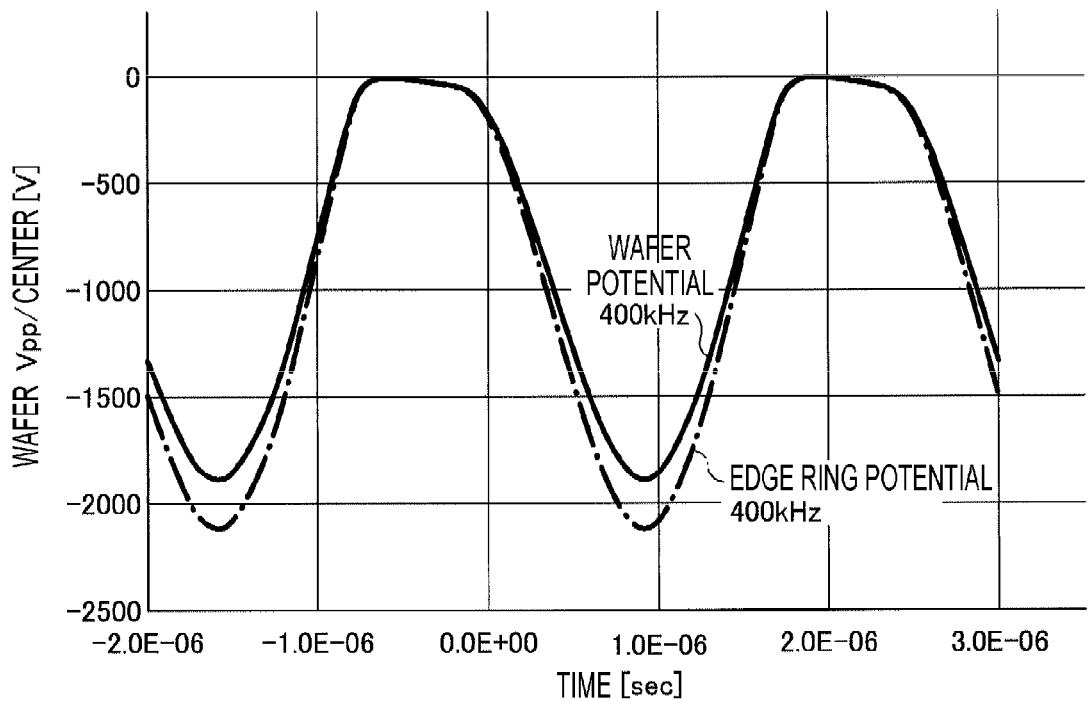
FIGS. 14A and 14B are views illustrating an example of a frequency of RF and a potential difference between a wafer and an edge ring according to the embodiment.
Figure 14B:
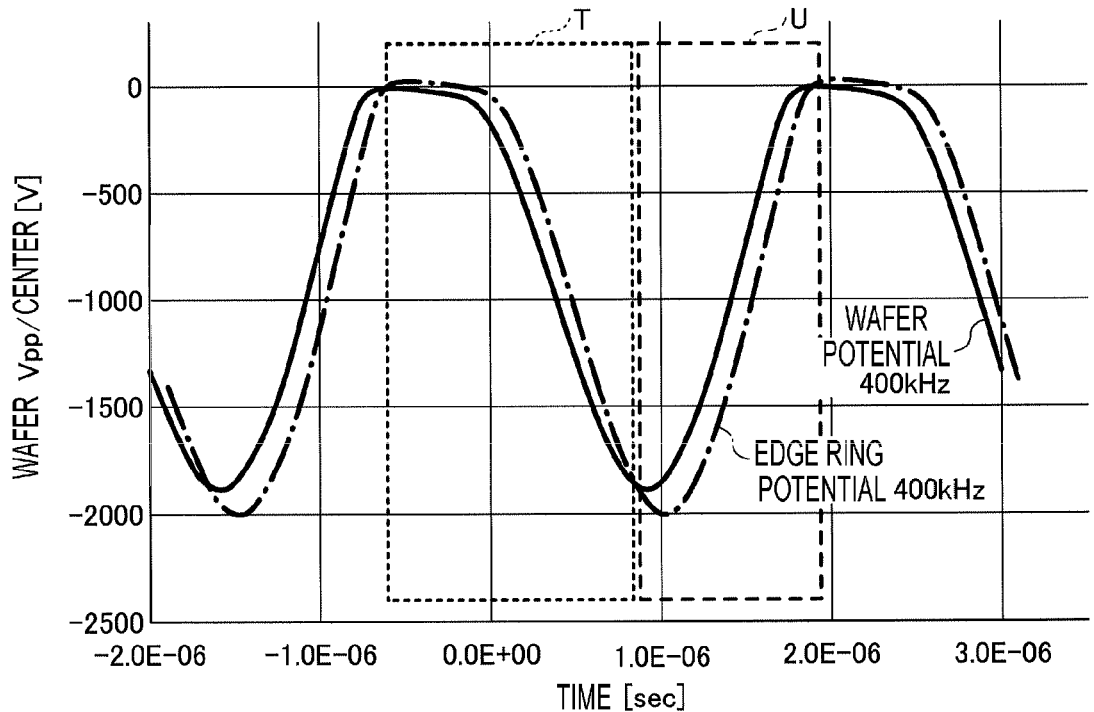

Next, descriptions will be made on a case where an RF voltage with the same frequency as the frequency of the bias power (400 kHz) is applied to the edge ring 24 as illustrated in FIGS. 14A and 14B. FIG. 14A represents the potential of the wafer W and the potential of the edge ring 24 in a case where the RF voltage is changed by making the phase of the RF voltage equal to the phase of the bias power. In this case, the relationship in size of sheath thickness between the wafer W and the edge ring 24 may not be changed. For example, while the potential of the edge ring 24 may be made deep, the sheath of the edge ring 24 may not be made thin.

FIG. 14B represents the potential of the wafer W and the potential of the edge ring 24 in a case where the phase of the RF voltage is changed with respect to the phase of the bias power. In this case, in the region T of FIG. 14B, the potential of the wafer W becomes deeper than the potential of the edge ring 24, and the sheath of the edge ring 24 becomes thinner than the sheath of the wafer W. Meanwhile, in the region U of FIG. 14B, the potential of the edge ring 24 becomes deeper than the potential of the wafer W, and the sheath of the edge ring 24 becomes thicker than the sheath of the wafer W. Hence, the incidence angle of ions in the vicinity of the edge of the wafer W may be directed inward or outward according to the potential difference between the potential of the wafer W and the potential of the edge ring 24. Thus, the roundness of a hole in the vicinity of the edge of the wafer W may collapse. Accordingly, when the RF voltage with the same frequency as that of the bias power is applied to the edge ring 24, it is preferable to align the phases of LF and RF.

Figure 15B:
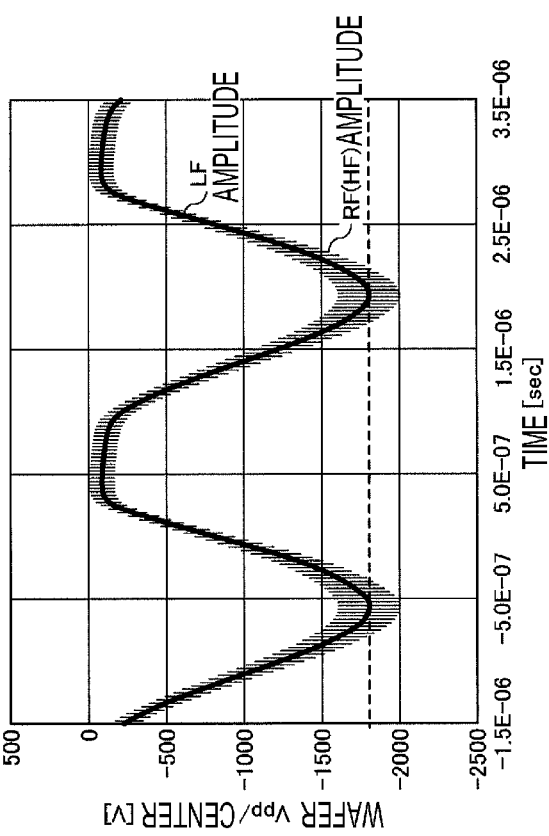
FIGS. 15A to 15C are views illustrating an example of a frequency of RF and a potential difference between a wafer and an edge ring according to the embodiment.
Figure 15A:
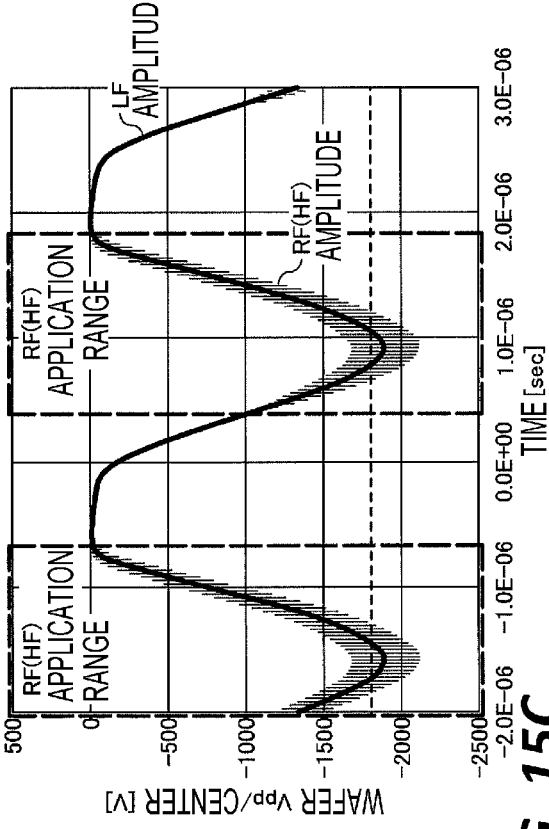
Figure 15C:
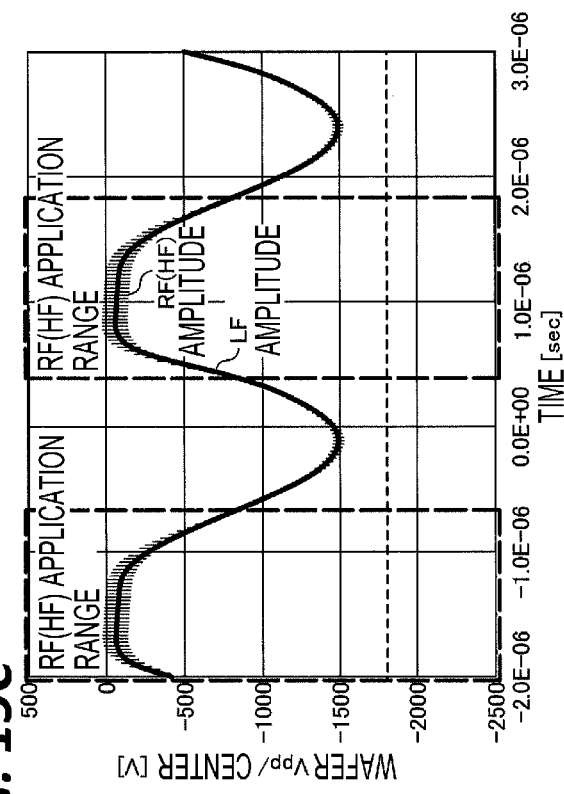

FIGS. 15A to 15C are views in which the application time of the RF voltage is adjusted in a case where the RF voltage with a frequency higher than the frequency of the bias power is applied to the edge ring 24. FIG. 15A represents the amplitude of the bias power and the amplitude of the RF voltage in a case where the RF voltage is applied when the wafer potential (which is substantially equal to the electrode potential) in which Vdc of LF is deep and Vpp is large is negative.

FIG. 15B represents the amplitude of the bias power and the amplitude of RF in a case where the RF voltage is continuously applied. FIG. 15C represents the amplitude of the bias power and the amplitude of RF in a case where the RF voltage is applied when the wafer potential is positive.

In FIG. 15A, the RF voltage is applied to the edge ring 24 at a timing when Vdc of LF is deep and Vpp is large. When the electrode potential is negative, the plasma density decreases, and the sheath of the edge ring 24 becomes thick. Accordingly, the incidence angle of ions in the vicinity of the edge of the wafer W may be corrected to be vertical or be directed radially outward.

Meanwhile, in FIG. 15C, when the electrode potential is positive, the plasma density increases, and the sheath of the edge ring 24 becomes thin. Accordingly, the incidence angle of ions in the vicinity of the edge of the wafer W may be corrected to be vertical or directed radially inward.

From the above, the thickness of sheath of the edge ring 24 may be controlled by continuously applying the RF voltage as illustrated in FIG. 15B or intermittently applying the RF voltage according to the value of the electrode potential as illustrated in FIGS. 15A and 15C. As a result, the etching shape in the vicinity of the edge of the wafer W may become favorable.

Descriptions have been made on the method of controlling the DC voltage to be applied to the edge ring 24 from the variable DC power supply 50. However, the present disclosure is not limited thereto, and for example, the radio-frequency voltage to be applied to the edge ring 24 from an AC power supply (not illustrated) may also be controlled in the same manner as the method of controlling the DC voltage.

That is, the plasma processing apparatus according to the present embodiment may include; a processing container; an electrode configured to place a workpiece thereon in the processing container; a plasma generation source configured to supply plasma into the processing container; a bias power supply configured to supply a bias power to the electrode; an edge ring disposed at a periphery of the workpiece; a radio-frequency power supply configured to supply a radio-frequency voltage having the same frequency as a frequency of the bias power to the edge ring; a storage medium having a program that includes a first control procedure of applying the radio-frequency voltage to generate a predetermined phase difference with respect to a phase of a potential of the electrode; and a controller configured to execute the program of the storage medium. The predetermined phase difference may be 90° to 270°.

In addition, for example, a voltage obtained by combining the DC voltage with another voltage, for example, combining the DC voltage with a voltage output in a triangular wave may be applied.

The program may be set at a predetermined position in a state of being stored in a portable computer-readable storage medium such as a CD-ROM or a DVD, and may be read out by the controller.

Modification 4

Figure 16:
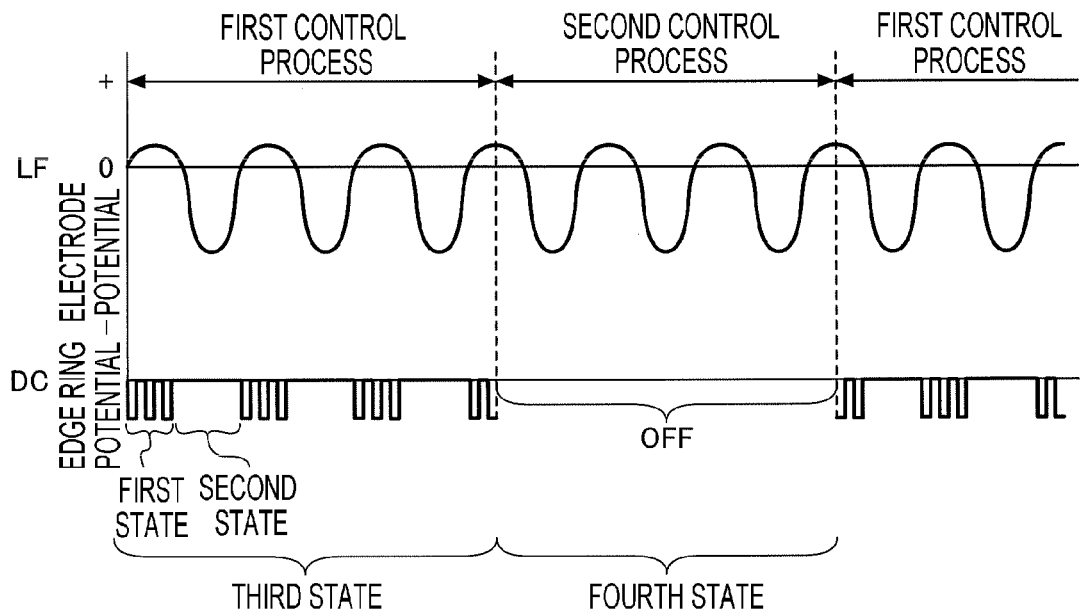
FIG. 16 is a timing chart illustrating a control method according to Modification 4 of the embodiment.

Modification 4 will be described with reference to FIG. 16. FIG. 16 is a timing chart illustrating a control method according to Modification 4 of the embodiment. In Modification 4, the first state of the DC voltage takes a pulse type voltage value in which two or more voltage values are repeated. In the example of FIG. 16, the first state of the DC voltage repeats a negative voltage value and a zero voltage value. However, the present disclosure is not limited thereto, and two or more voltage values, for example, three voltage values may be repeated.

Modification 5

Figure 17:
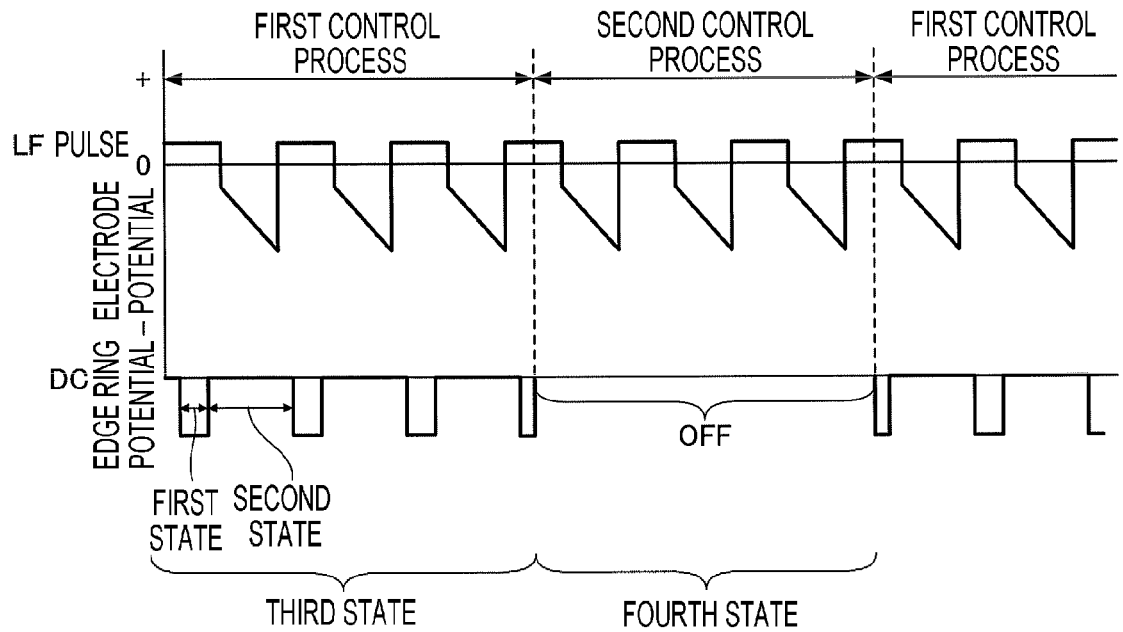
FIG. 17 is a timing chart illustrating a control method according to Modification 5 of the embodiment.

Modification 5 will be described with reference to FIG. 17. FIG. 17 is a timing chart illustrating a control method according to Modification 5 of the embodiment. The bias power may be a power of a sine waveform, a pulse waveform, or a tailored waveform. That is, the bias voltage or current may be a sine waveform or an LF pulse waveform. The LF pulse includes an arbitrary waveform such as the tailored waveform illustrated in FIG. 17, in addition to the waveform illustrated in FIG. 11. In the tailored waveform, the bias power may be modulated when the DC voltage illustrated in FIG. 17 is in the second state or in the first state.

Similarly, when the first state of the DC voltage takes two or more voltage values, in the waveform of the DC voltage, the first state may take two or more voltage values, and the second state may take two or more voltage values as illustrated in FIGS. 12A to 12D. The voltage value of the second state may be zero. In addition, as illustrated in FIG. 16, the first state may repeat two or more voltage values. The waveform of the first or second state of the DC voltage may be the tailored waveform illustrated in FIG. 17, similarly to the LF pulse.

As described above, the potential of the electrode may be determined by the periodically varying parameter measured in the transmission path of the bias power. The periodically changing parameter may be a variance of a voltage, current, electromagnetic field, light emission of generated plasma, or sheath thickness above the workpiece. The potential of the electrode may be determined by a signal synchronized with the period of the radio-frequency or pulse wave of the bias power.

The plasma processing apparatus according to the present disclosure may be applied to any type of capacitively coupled plasma (CCP), inductively coupled plasma (ICP), a radial line slot antenna (RLSA), electron cyclotron resonance plasma (ECR), and helicon wave plasma (HWP).

In the descriptions herein, the semiconductor wafer W has been described as an example of the workpiece. However, the workpiece may not be limited thereto and may be, for example, various substrates used in a liquid crystal display (LCD) and a flat panel display (FPD), a CD substrate or a printed circuit board.

According to an aspect, it is possible to improve the precision of the etching shape of the workpiece.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a container;
a stage disposed in the container and including an electrode;
a plasma source configured to generate plasma in the container;
a bias power supply configured to periodically supply a pulsed negative DC voltage to the electrode;
an edge ring disposed to surround a substrate placed on the stage; and
a DC power supply configured to supply a DC voltage to the edge ring,
wherein the DC power supply is configured to supply a first DC voltage in a first time period when the pulsed negative DC voltage of the bias power supply is not supplied to the electrode, and the DC power supply is further configured to supply a second DC voltage in a second time period when the pulsed negative DC voltage of the bias power supply is supplied to the electrode, and
wherein the first DC voltage is corrected by a correction amount corresponding to an amount of consumption of the edge ring based on measurement of the edge ring.

2. The plasma processing apparatus according to claim 1, wherein the DC power supply intermittently stops supplying the DC voltage in an independent period from a period of the pulsed negative DC voltage.

3. The plasma processing apparatus according to claim 1, wherein the bias power supply intermittently stops supplying the pulsed negative DC voltage in an independent period from a period of the DC voltage.

4. The plasma processing apparatus according to claim 1, wherein the DC power supply intermittently stops supplying the DC voltage in an independent period from a period of the pulsed negative DC voltage, and synchronously, the bias power supply intermittently stops supplying the pulsed negative DC voltage in an independent period from a period of the DC voltage.

5. The plasma processing apparatus according to claim 1, wherein the first DC voltage takes two or more voltage values.

6. The plasma processing apparatus according to claim 5, wherein the first DC voltage repeats the two or more voltage values.

7. The plasma processing apparatus according to claim 1, wherein the second DC voltage takes two or more voltage values.

8. The plasma processing apparatus according to claim 1, wherein a voltage value of the second DC voltage is zero.

9. The plasma processing apparatus according to claim 8, wherein the first DC voltage is a negative DC voltage.

10. The plasma processing apparatus according to claim 1, wherein the DC power supply is configured to only supply a negative DC voltage or a zero voltage to the edge ring.

11. The plasma processing apparatus according to claim 1, wherein the first DC voltage and the second DC voltage are repeatedly supplied at least twice, and the DC power supply is configured to not supply a positive DC voltage in the first time period when the pulsed negative DC voltage is not supplied to the electrode.

12. The plasma processing apparatus according to claim 1, wherein no positive DC voltage is supplied to the edge ring in the first time period and the second time period.

13. The plasma processing apparatus according to claim 1, wherein the apparatus includes a controller configured to determine a value of the consumption amount of the edge ring based on the measurement of the edge ring, and to determine the correction amount of the first DC voltage corresponding to the value of the consumption amount.

14. A plasma processing apparatus comprising:
a container;
a stage disposed in the container and including an electrode;
a plasma source configured to generate plasma in the container;

a bias power supply configured to periodically supply a pulsed negative DC voltage to the electrode;

an edge ring disposed to surround a substrate placed on the stage; and a radio-frequency power supply configured to supply a radio-frequency voltage to the edge ring, wherein the radio-frequency power supply is configured to supply a positive radio-frequency voltage in a first time period when the pulsed negative DC voltage is not supplied to the electrode, and supply a negative radio-frequency voltage in a second time period when the pulsed negative DC voltage is supplied to the electrode.

15. The plasma processing apparatus according to claim 14, wherein the radio-frequency power supply intermittently stops supplying the radio-frequency voltage in an independent period from a period of the pulsed negative DC voltage.

16. The plasma processing apparatus according to claim 14, wherein the bias power supply intermittently stops supplying the pulsed negative DC voltage in an independent period from a period of the radio-frequency voltage.

17. The plasma processing apparatus according to claim 14, wherein the radio-frequency power supply intermittently stops supplying the radio-frequency voltage in the independent period from a period of the pulsed negative DC voltage, and synchronously, the bias power supply intermittently stops supplying the pulsed negative DC voltage in an independent period from a period of the radio-frequency voltage.

18. A method of controlling a plasma processing apparatus that includes:

a container;

a stage disposed in the container and including an electrode;

a plasma source configured to generate plasma in the container;

a bias power supply configured to periodically supply a pulsed negative DC voltage to the electrode;

an edge ring disposed to surround a substrate placed on the stage; and a power supply configured to supply a DC voltage to the edge ring or a radio-frequency voltage to the edge ring, the method comprising:

when the power supply supplies the DC voltage, controlling the power supply to supply a first DC voltage in a first time period when the pulsed negative DC voltage is not supplied to the electrode, and supply a second DC voltage in a second time period when the pulsed negative DC voltage is supplied to the electrode, and when the power supply supplies the radio-frequency voltage, controlling the power supply to supply a positive radio-frequency voltage in a first time period when the pulsed negative DC voltage is not supplied to the electrode, and supply a negative radio-frequency voltage in a second time period when the pulsed negative DC voltage is supplied to the electrode.

19. The method according to claim 18, further comprising:

generating a synchronization signal to be synchronized with a potential of the electrode, generating a control signal for the power supply that is output from the synchronization signal, and transmitting the generated control signal to at least one of the power supply and a phase shift circuit, and supplying a DC voltage to the edge ring from at least one of the power supply and the phase shift circuit.

20. The method according to claim 18, further comprising:

generating a control signal for the pulsed negative DC voltage that is output from the bias power supply, and transmitting the generated control signal to a phase shift circuit; and supplying the radio-frequency voltage to the edge ring from the phase shift circuit.

21. The method according to claim 18, wherein the supply of the DC voltage is intermittently stopped in an independent period from a period of the pulsed negative DC voltage.

22. The method according to claim 18, wherein the supply of the pulsed negative DC voltage is intermittently stopped in an independent period from a period of the DC voltage.

23. The method according to claim 18, wherein the supply of the radio-frequency voltage is intermittently stopped in an independent period from a period of the pulsed negative DC voltage.

24. The method according to claim 18, wherein the supply of the pulsed negative DC voltage is intermittently stopped in an independent period from a period of the radio-frequency voltage.

* * * * *